(12) United States Patent
Forrest et al.

(10) Patent No.: US 7,750,425 B2
(45) Date of Patent: Jul. 6, 2010

(54) INTERMEDIATE-BAND PHOTOSENSITIVE DEVICE WITH QUANTUM DOTS EMBEDDED IN ENERGY FENCE BARRIER

(75) Inventors: Stephen R. Forrest, Ann Arbor, MI (US); Guodan Wei, Ann Arbor, MI (US)

(73) Assignee: The Trustees of Princeton University, Princeton, NJ (US)

( * ) Notice: Subject to any disclaimer, the term of this patent is extended or adjusted under 35 U.S.C. 154(b) by 811 days.

(21) Appl. No.: 11/598,006

(22) Filed: Nov. 13, 2006

(65) Prior Publication Data

US 2007/0151592 A1 Jul. 5, 2007

Related U.S. Application Data

(63) Continuation-in-part of application No. 11/304,713, filed on Dec. 16, 2005.

(51) Int. Cl.
*H01L 27/14* (2006.01)
(52) U.S. Cl. .................................. 257/441; 136/258
(58) Field of Classification Search .............. 257/441; 136/258, 265
See application file for complete search history.

(56) References Cited

U.S. PATENT DOCUMENTS

| | | | |
|---|---|---|---|
| 5,079,601 A | | 1/1992 | Esaki et al. |
| 6,239,449 B1 | | 5/2001 | Fafard et al. |
| 6,444,897 B1 | * | 9/2002 | Luque-Lopez et al. ...... 136/255 |
| 6,583,436 B2 | | 6/2003 | Petroff et al. |
| 6,753,273 B2 | | 6/2004 | Holonyak, Jr. et al. |
| 2002/0020892 A1 | | 2/2002 | Shima |
| 2002/0092987 A1 | | 7/2002 | Cho et al. |
| 2002/0094597 A1 | | 7/2002 | Lin et al. |
| 2003/0073258 A1 | | 4/2003 | Mukai et al. |
| 2004/0129931 A1 | | 7/2004 | Asryan et al. |
| 2004/0209416 A1 | | 10/2004 | Holonyak, Jr. et al. |
| 2005/0155641 A1 | | 7/2005 | Fafard |
| 2006/0266998 A1 | * | 11/2006 | Vega et al. ................ 257/21 |

OTHER PUBLICATIONS

Anderson. Ideal theory of quantum well solar cells. Journal of Applied Physics 78 (3), Aug. 1, 1995, pp. 1850-1861.
Aroutiounian et al. Quantum dot solar cells. Journal of Applied Physics, vol. 89, No. 4, Feb. 15, 2001, pp. 2268-2271.
Aroutiounian et al. Studies of the photocurrent in quantum dot solar cells by the application of a new theoretical model. Solar Energy Materials & Solar Cells 89, (2005), pp. 165-173.

(Continued)

*Primary Examiner*—Thomas L Dickey

(57) ABSTRACT

A plurality of layers of a first semiconductor material and a plurality of dots-in-a-fence barriers disposed in a stack between a first electrode and a second electrode. Each dots-in-a-fence barrier consists essentially of a plurality of quantum dots of a second semiconductor material embedded between and in direct contact with two layers of a third semiconductor material. Wave functions of the quantum dots overlap as at least one intermediate band. The layers of the third semiconductor material are arranged as tunneling barriers to require a first electron and/or a first hole in a layer of the first material to perform quantum mechanical tunneling to reach the second material within a respective quantum dot, and to require a second electron and/or a second hole in a layer of the first semiconductor material to perform quantum mechanical tunneling to reach another layer of the first semiconductor material.

19 Claims, 20 Drawing Sheets

OTHER PUBLICATIONS

Asryan et al. Inhomogeneous line broadening and the threshold current density of a semiconductor quantum dot laser. Semicond. Sci. Technol. 11 (1996), pp. 554-567.

Brandt et al. Heavy- and light-hole character of optical transitions in InAs/GaAs single-monolayer quantum wells. Physical Review B, vol. 45, No. 8, Feb. 15, 1992, pp. 4217-4220.

Chang et al. Photocurrent studies of the carrier escape process from InAs self-assembled quantum dots. Physical Review B, vol. 62, No. 11, Sep. 15, 2000, pp. 6959-6962.

Colombelli et al. Conduction-band offset of single InAs monolayers on GaAs. Applied Physics Letters, vol. 76, No. 9, Feb. 28, 2000, pp. 1146-1148.

Datta et al. Volume VIII Quantum Phenomena. Modular Series on Solid State Devices, Addison Wesley Publishing Company, New York, 1989, p. 228-235.

Ebiko et al. "Island Size Scaling in InAs/GaAs Self-Assembled Quantum Dots," Physical Review Letters 80, pp. 2650-2653 (1998).

Engstrom et al. Electron capture cross sections of InAs/GaAs quantum dots. Applied Physics Letters, vol. 85, No. 14, Oct. 4, 2004, pp. 2908-2910.

Fu et al. Emission rates for electron tunneling from InAs quantum dots to GaAs substrate. Journal of Applied Physics, vol. 96, No. 11, Dec. 1, 2004, pp. 6477-6481.

Han et al. Intersubband optical absorption in quantum dots-in-a well heterostructures. Journal of Applied Physics 98, (2005), pp. 053703-1 thru 053703-5.

Harrison et al. Quantum Wells, Wires and Dots, Theoretical and Computational Physics of Semiconductor Nanostructures. Second Edition. Wiley, England, 2005, p. 459-460.

Holm et al. Calculations of the electronic structure of strained InAs quantum dots in InP. Journal of Applied Physics, vol. 92, No. 2, Jul. 15, 2002, pp. 932-936.

International Search Report for PCT Application Serial No. PCT/US06/046910, mailed on Feb. 1, 2008.

Luque et al. Physical Review Letters, vol. 78, No. 26, Jun. 30, 1997, pp. 5014-5017.

Luque, et al. "Progress toward the practical implementation of the intermediate band solar cell." Conference Record of the Twenty-Ninth IEEE Photovoltaic Specialists Conference, pp. 1190-1193 (2002).

Marti et al. "Partial Filling of a Quantum Dot Intermediate Band for Solar Cells." IEEE Transaction on Electron Devices, 48, pp. 2394-2399 (2001).

Marti et al. "Design constraints of quantum-dot intermediate band solar cell." Physical E 14, pp. 150-157 (2002).

Marti et al. Novel semiconductor solar cell structures: The quantum dot intermediate band solar cell. Thin Solid Films 511-512 (2006), pp. 638-644.

Marzin et al. Photoluminescence of Single InAs Quantum Dots Obtained by Self-Organized Growth on GaAs. Physical Review Letters, vol. 73, No. 5, Aug. 1, 1994, pp. 716-719.

Morris et al. Electron and hole capture in multiple-quantum-well structures. Physical Review B, vol. 47, No. 11, March 15, 1993, pp. 6819-6822.

Ng. "Complete Guide to Semiconductor Devices." 2d ed., Appendix B8, Tunneling, pp. 625-627, Wiley-Interscience (2002).

Pierret. "Modular Series On Solid State Devices vol. VI, Advanced Semiconductor Fundamentals." Chapter 2, Elements of Quantum Mechanics, pp. 25-51, Addison-Wesley Publishing (1989).

Rimada et al. Quantum and conversion efficiency calculation of AIGaAs/GaAs multiple quantum well solar cells. Phys. Stat. Sol. (b) 242, No. 9 (2005), pp. 1842-1845.

Schaller et al. High Efficiency Carrier Multiplication in PbSe Nanocrystals: Implications for Solar Energy Conversion. Physical Review Letters, vol. 92, No. 18, May 7, 2004, pp. 186601-1 thru 186601-4.

Sionnest. Quantum Dots A new quantum state? Nature Materials, vol. 4, Sep. 2005, pp. 653-654.

Suzuki et al. Tunneling Spectroscopy of InAs Wetting Layers and Self-Assembled Quantum Dots: Resonant Tunneling through Two- and Zero-Dimensional Electronic States. Appl. Phys., vol. 36, (1997), pp. 1917-1921.

Tobin et al. Assessment of MOCVD- and MBE-Grown GaAs for High-Efficiency Solar Cell Applications. IEE Transactions of Electron Devices, vol. 37, No. 2, Feb. 1990, pp. 469-477.

Wetzler et al. Capacitance-voltage characteristics of InAs/GaAs quantum dots embedded in a pn structure. Applied Physics Letter, vol. 77, No. 11, Sep. 11, 2000, pp. 1671-1673.

Yeoh et al. Epitaxy of InAs quantum dots on self-organized two-dimensional InAs islands by atmospheric pressure metalorganic chemical vapor deposition. Applied Physics Letters, vol. 79, No. 2, July 9, 2001, pp. 221-223.

Zhang, et al. Coulomb Charging Effect in Self-Assembled Ge Quantum Dots Studied by Admittance Spectroscopy. Physical Review Letters, vol. 80, No. 15, April 13, 1998, pp. 3340-3343.

International Search Report for PCT Application Serial No. PCT/US06/046910, mailed on Feb. 1, 2008.

Wei, G. et al. Intermediate-Band Solar Cells Employing Quantum Dots Embedded in an Energy Fence Barrier. Nano Letters, AC, Washington, DC, US, vol. 7, No. 1, Dec. 2, 2006, pp. 218-222.

Takeru Amano et al., "1.3-um InAs Quantum-Dot Laser With High Dot Density and High Uniformity," IEEE Photonics Technology Letters, vol. 18, No. 4, pp. 619-621 (2006).

Jie Liang et al., "Broad-Band Photoresponse From InAs Quantum Dots Embedded Into InGaAs Graded Well," IEEE Electron Device Letters, vol. 26, No. 9, pp. 631-633 (2005).

A. Stintz et al., "Low-Threshold Current Density 1.3-um InAs Quantum-Dot Lasers with the Dots-in-a-Well (DWELL) Structure," IEEE Photonics Technology Letters, vol. 12, No. 6, pp. 591-593 (2000).

T.C. Newell et al., "Gain and Linewidth Enhancement Factor in InAs Quantum-Dot Laser Diodes," IEEE Photonics Technology Letters, vol. 11, No. 12, pp. 1527-1529 (1999).

\* cited by examiner

FIG. 1
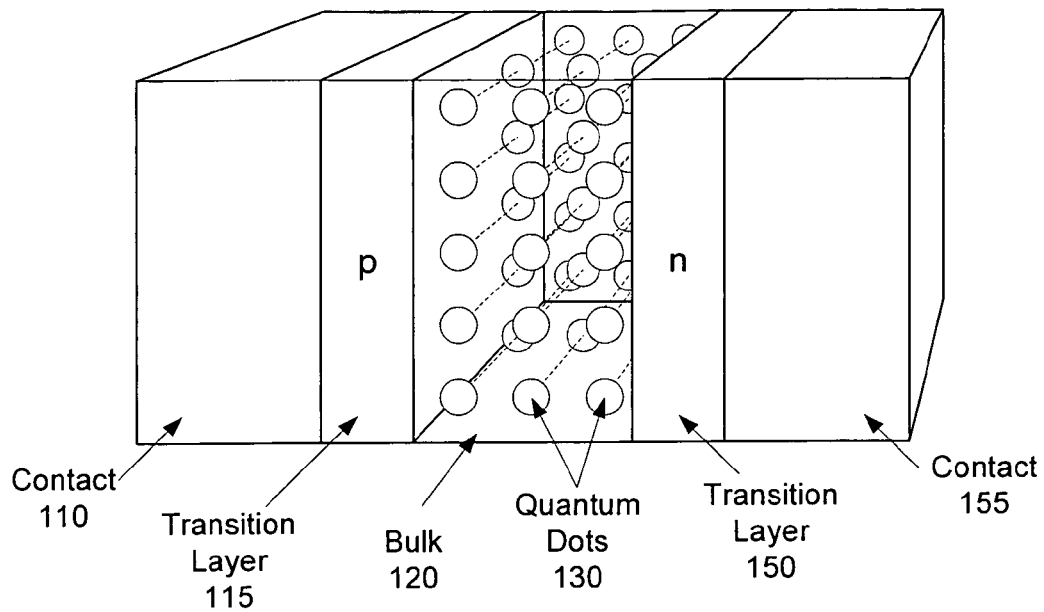
Contact 110
Transition Layer 115
Bulk 120
Quantum Dots 130
Transition Layer 150
Contact 155
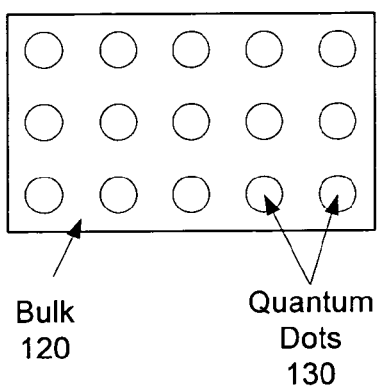
FIG. 5
Bulk 120
Quantum Dots 130
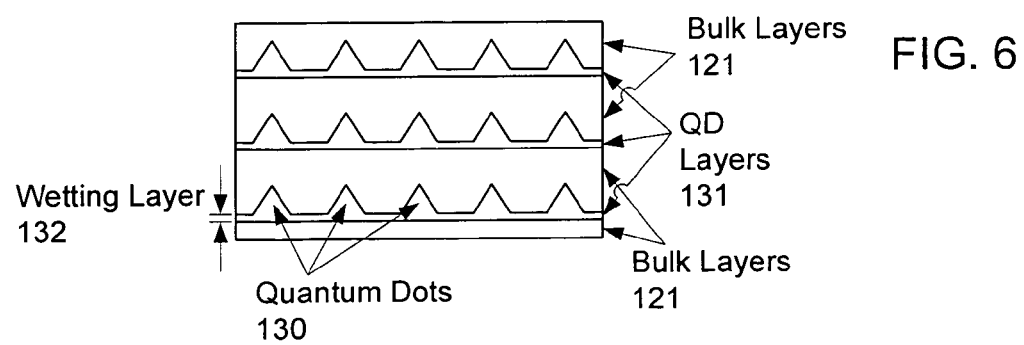
FIG. 6
Bulk Layers 121
QD Layers 131
Wetting Layer 132
Quantum Dots 130
Bulk Layers 121

INTERMEDIATE-BAND PHOTOSENSITIVE DEVICE WITH QUANTUM DOTS EMBEDDED IN ENERGY FENCE BARRIER

RELATED APPLICATIONS

This application is a continuation-in-part of U.S. application Ser. No. 11/304,713 filed Dec. 16, 2005 (pending), the contents of which are incorporated herein by reference.

UNITED STATES GOVERNMENT RIGHTS

This invention was made with government support under Contract No. XAT-5-33636-03 awarded by the U.S. Department of Energy, National Renewable Energy Laboratory. The government has certain rights in the invention.

JOINT RESEARCH AGREEMENT

Portions of the claimed invention were made by, on behalf of, and/or in connection with one or more of the following parties to a joint university-corporation research agreement Princeton University, The University of Southern California, and Global Photonic Energy Corporation. The remainder of the claimed invention was made by, on behalf of, and/or in connection with one or more of the following parties to a joint university-corporation research agreement. The University of Michigan, The University of Southern California, and Global Photonic Energy Corporation. The agreements were in effect on and before the date the respective portions of the claimed invention were made, and the claimed invention was made as a result of activities undertaken within the scope of the agreements.

FIELD OF THE INVENTION

The present invention generally relates to photosensitive optoelectronic devices. More specifically, it is directed to intermediate-band photosensitive optoelectronic devices with inorganic quantum dots providing the intermediate band in an inorganic semiconductor matrix.

BACKGROUND

Optoelectronic devices rely on the optical and electronic properties of materials to either produce or detect electromagnetic radiation electronically or to generate electricity from ambient electromagnetic radiation.

Photosensitive optoelectronic devices convert electromagnetic radiation into an electrical signal or electricity. Solar cells, also called photovoltaic ("PV") devices, are a type of photosensitive optoelectronic device that is specifically used to generate electrical power. Photoconductor cells are a type of photosensitive optoelectronic device that are used in conjunction with signal detection circuitry which monitors the resistance of the device to detect changes due to absorbed light. Photodetectors, which may receive an applied bias voltage, are a type of photosensitive optoelectronic device that are used in conjunction with current detecting circuits which measures the current generated when the photodetector is exposed to electromagnetic radiation.

These three classes of photosensitive optoelectronic devices may be distinguished according to whether a rectifying junction as defined below is present and also according to whether the device is operated with an external applied voltage, also known as a bias or bias voltage. A photoconductor cell does not have a rectifying junction and is normally operated with a bias. A PV device has at least one rectifying junction and is operated with no bias. A photodetector has at least one rectifying junction and is usually but not always operated with a bias.

As used herein, the term "rectifying" denotes, inter alia, that an interface has an asymmetric conduction characteristic, i.e., the interface supports electronic charge transport preferably in one direction. The term "photoconductive" generally relates to the process in which electromagnetic radiant energy is absorbed and thereby converted to excitation energy of electric charge carriers so that the carriers can conduct (i.e., transport) electric charge in a material. The term "photoconductive material" refers to semiconductor materials which are utilized for their property of absorbing electromagnetic radiation to generate electric charge carriers. When electromagnetic radiation of an appropriate energy is incident upon a photoconductive material, a photon can be absorbed to produce an excited state. There may be intervening layers, unless it is specified that the first layer is "in physical contact with" or "in direct contact with" the second layer.

In the case of photosensitive devices, the rectifying junction is referred to as a photovoltaic heterojunction. To produce internally generated electric fields at the photovoltaic heterojunction which occupy a substantial volume, the usual method is to juxtapose two layers of material with appropriately selected semi-conductive properties, especially with respect to their Fermi levels and energy band edges.

Types of inorganic photovoltaic heterojunctions include a p-n heterojunction formed at an interface of a p-type doped material and an n-type doped material, and a Schottky-barrier heterojunction formed at the interface of an inorganic photoconductive material and a metal.

In inorganic photovoltaic heterojunctions, the materials forming the heterojunction have been denoted as generally being of either n-type or p-type. Here n-type denotes that the majority carrier type is the electron. This could be viewed as a material having many electrons in relatively free energy states. The p-type denotes that the majority carrier type is the hole. Such a material has many holes in relatively free energy states.

One common feature of semiconductors and insulators is a "band gap." The band gap is the energy difference between the highest energy level filled with electrons and the lowest energy level that is empty. In an inorganic semiconductor or inorganic insulator, this energy difference is the difference between the valence band edge $E_V$ (top of the valence band) and the conduction band edge $E_C$ (bottom of the conduction band). The band gap of a pure material is devoid of energy states where electrons and holes can exist. The only available carriers for conduction are the electrons and holes which have enough energy to be excited across the band gap. In general, semiconductors have a relatively small band gap in comparison to insulators.

In terms of an energy band model, excitation of a valence band electron into the conduction band creates carriers; that is, electrons are charge carriers when on the conduction-band-side of the band gap, and holes are charge carriers when on the valence-band-side of the band gap.

As used herein, a first energy level is "above," "greater than," or "higher than" a second energy level relative to the positions of the levels on an energy band diagram under equilibrium conditions. Energy band diagrams are a workhorse of semiconductor models. As is the convention with inorganic materials, the energy alignment of adjacent doped materials is adjusted to align the Fermi levels ($E_F$) of the respective materials, bending the vacuum level between doped-doped interfaces and doped-intrinsic interfaces.

As is the convention with energy band diagrams, it is energetically favorable for electrons to move to a lower energy level, whereas it is energetically favorable for holes to move to a higher energy level (which is a lower potential energy for a hole, but is higher relative to an energy band diagram). Put more succinctly, electrons fall down whereas holes fall up.

In inorganic semiconductors, there may be a continuum of conduction bands above the conduction band edge ($E_C$) and a continuum of valence bands below the valence band edge ($E_V$).

Carrier mobility is a significant property in inorganic and organic semiconductors. Mobility measures the ease with which a charge carrier can move through a conducting material in response to an electric field. In comparison to semiconductors, insulators generally provide poor carrier mobility.

SUMMARY OF THE INVENTION

A device comprises a plurality of layers of a first semiconductor material and a plurality of dots-in-a-fence barriers disposed in a stack between a first electrode and a second electrode. Each dots-in-a-fence barrier is disposed in the stack between and in direct contact with a respective two of the layers of the first semiconductor material. Each dots-in-a-fence barrier consists essentially of a plurality of quantum dots of a second semiconductor material embedded between and in direct contact with two layers of a third semiconductor material. Each quantum dot provides at least one quantum state at an energy between a conduction band edge and a valence band edge of the adjacent layers of the first semiconductor material. Wave functions of the at least one quantum state of the plurality of quantum dots overlap as at least one intermediate band. The layers of the third semiconductor material are arranged as tunneling barriers to require a first electron and/or a first hole in a layer of the first material to perform quantum mechanical tunneling to reach the second material within a respective quantum dot. The layers of the third semiconductor material are also arranged as tunneling barriers to require a second electron and/or a second hole in a layer of the first semiconductor material to perform quantum mechanical tunneling to reach another layer of the first semiconductor material without passing through a quantum dot. The lattice constants of the first semiconductor material and the third semiconductor material are preferably sufficiently close to avoid inducing defects (e.g., $|\Delta\alpha/\alpha|<1\%$). More preferably, the third semiconductor material is lattice matched to the first semiconductor material.

As a first set of example materials, the first semiconductor material is GaAs, the second semiconductor material is InAs, and the third semiconductor material is $Al_xGa_{1-x}As$ with $x>0$. Preferably, each InAs quantum dot has an average lateral cross-section of 2 R and a height of l, with $2\,nm \leq R \leq 10\,nm$, and each $Al_xGa_{1-x}As$ layer has a thickness t, with $0.1\,R \leq t \leq 0.3\,R$. Each GaAs layer disposed between two dots-in-a-fence barriers has a thickness d, with $2\,nm \leq d \leq 10\,nm$. A period of a quantum dot unit cell within a respective dots-in-a-fence barrier is L, with $2\,R \leq L \leq 2\,R+2\,nm$, and a period of a quantum dot unit cell between adjacent dots-in-a-fence barriers is $L_z$, with $L_z=l+d+t$. To obtain a carrier escape rate similar to the conventional structure with no barrier fences, $6\,nm \leq R \leq 8\,nm$. The preferred density of embedded InAs quantum dots in the GaAs bulk is from $10^{10}$ to $10^{12}$ quantum dots per square centimeter.

As a second set of example materials, the first semiconductor material is InP, the second semiconductor material is InAs, and the third semiconductor material is $Al_{0.48}In_{0.52}As$. Preferably, each InAs quantum dot has an average lateral cross-section of 2 R and a height of l, with $2\,nm \leq R \leq 12\,nm$, and each $Al_{0.48}In_{0.52}As$ layer has a thickness t, with $0.1\,R \leq t \leq 0.3\,R$. Each InP layer disposed between two dots-in-a-fence barriers has a thickness d, with $2\,nm \leq d \leq 12\,nm$. A period of a quantum dot unit cell within a respective dots-in-a-fence barrier is L, with $2\,R \leq L \leq 2\,R+2\,nm$, and a period of a quantum dot unit cell between adjacent dots-in-a-fence barriers is $L_z$, with $L_z=l+d+t$.

If the device is arranged as a p-i-n heterostructure, a first layer of the plurality of layers of the first material nearest to the first electrode is n-doped, a second layer of the plurality of layers of the first material nearest to the second electrode is p-doped, and the other layers of the plurality of layers of the first material are intrinsic. The device can be oriented so that either the n-doped first layer or the p-doped second layer is the layer closer to the substrate/semiconductor wafer. Moreover, one of the n-doped first layer and the p-doped second layer may be the substrate/semiconductor wafer.

The at least one quantum state in each quantum dot can include a quantum state above a band gap of the second semiconductor material providing an intermediate band and/or can include a quantum state below a band gap of the second semiconductor material providing an intermediate band.

The quantum dots in the dots-in-a-fence barriers may be arranged in a photosensitive device such as a solar cell.

BRIEF DESCRIPTION OF THE DRAWINGS

FIG. 1 illustrates an intermediate band solar cell.

FIG. 5 illustrates a cross-section of the array of quantum dots in the device in FIG. 1, as generally idealized and as formed in colloidal solutions.

FIG. 6 illustrates a cross-section of the array of quantum dots in the device in FIG. 1, if produced using the Stranski-Krastanow method.

FIG. 19A illustrates an on-dot band diagram (along line "A" in FIG. 18) and FIG. 19B illustrates an off-dot band diagram (along line "B" in FIG. 18). As the thin InAs wetting layer 1832 has negligible impact on tunneling, it is not represented in FIG. 19B.

FIG. 26A illustrates an on-dot band diagram (along line "A" in FIG. 25) and FIG. 26B illustrates an off-dot band diagram (along line "B" in FIG. 25). As the thin InAs wetting layer 2532 has negligible impact on tunneling, it is not represented in FIG. 26B.

Figure 2A:
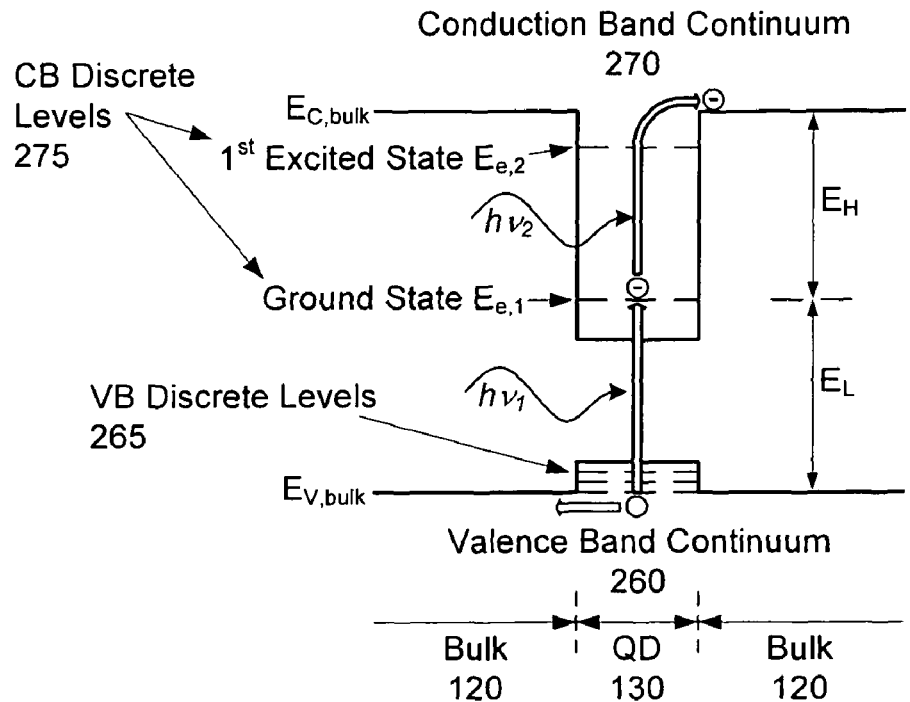
FIGS. 2A and 2B are energy-band diagrams for a cross-section of an inorganic quantum dot in an inorganic matrix material, with the lowest quantum state in the conduction band providing the intermediate band.

The structures in the figures are not necessarily drawn to scale.

DETAILED DESCRIPTION

One method being explored to improve the efficiency of solar cells is to use quantum dots to create an intermediate band within the bandgap of the solar cell. Quantum dots confine charge carriers (electrons, holes, and/or excitons) in three-dimensions to discrete quantum energy states. The cross-sectional dimension of each quantum dot is typically on the order of hundreds of Ångstroms or smaller. An intermediate-band structure is distinguishable, among other ways, by the overlapping wave functions between dots. The "intermediate" band is the continuous miniband formed by the overlapping wave functions. Although the wave functions overlap, there is no physical contact between adjacent dots.

FIG. 1 illustrates an example of an intermediate-band device. The device comprises a first contact 110, a first transition layer 115, a plurality of quantum dots 130 embedded in a semiconductor bulk matrix material 120, a second transition layer 150, and a second contact 155.

In a device made of inorganic materials, one transition layer (115, 150) may be p-type, with the other transition layer being n-type. The bulk matrix material 120 and the quantum dots 130 may be intrinsic (not doped). The interfaces between the transition layers 115, 150 and the bulk matrix material 120 may provide rectification, polarizing current flow within the device. As an alternative, current-flow rectification may be provided by the interfaces between the contacts (110, 155) and the transition layers (115, 150).

Depending upon the arrangement of bands, the intermediate-band may correspond to a lowest quantum state above the band gap in the dots 130, or a highest quantum state below the band gap in the dots 130.

FIGS. 2A, 2B, 3A, and 3B are energy-band diagrams for cross-sections through example inorganic quantum dots 130 in an inorganic bulk matrix material 120. Within the dots, the conduction band is divided into quantum states 275, and the valence band is divided into quantum states 265.

Figure 2B:
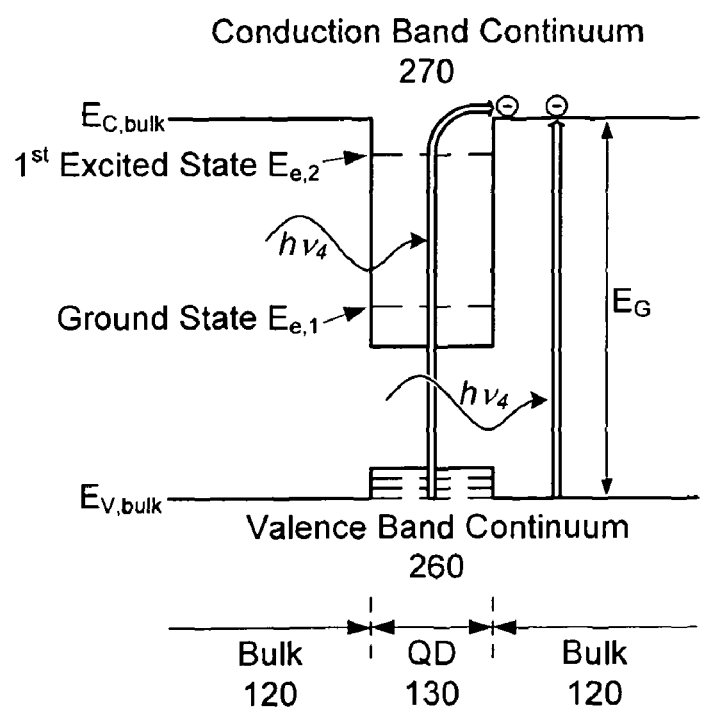

In FIGS. 2A and 2B, the lowest quantum state ($E_{e,1}$) in the conduction band of a dot provides the intermediate band 280. Absorption of a first photon having energy $hv_1$ increases the energy of an electron by $E_L$, exciting the electron from the valence band to the conduction band electron ground state $E_{e,1}$ of the quantum dot. Absorption of a second photon having energy $hv_2$ increases the energy of the electron by $E_H$, exciting the electron from the ground state $E_{e,1}$ of the quantum dot to the conduction band edge of the bulk semiconductor 120, whereupon the electron is free to contribute to photocurrent. Absorption of a third photon having energy $hv_4$ increases the energy of an electron by $E_G$, exciting the electron directly from the valence band into the conduction band (which can also occur in the bulk matrix material 120 itself), whereupon the electron is free to contribute to photocurrent.

Figure 3A:
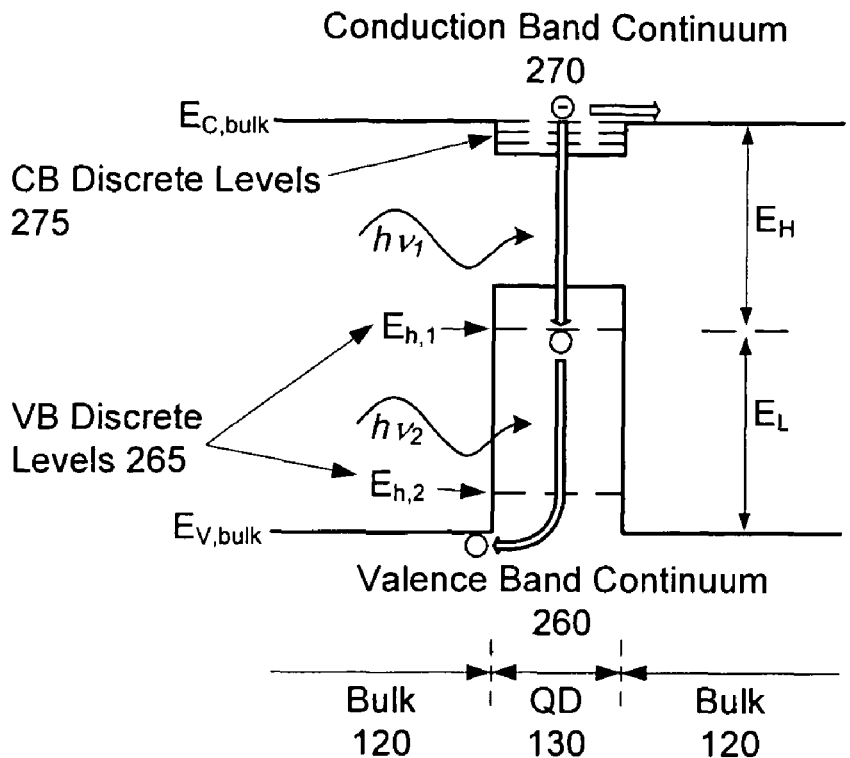
FIGS. 3A and 3B are energy-band diagrams for a cross-section of an inorganic quantum dot in an inorganic matrix material, with the highest quantum state in the valence band providing the intermediate band.
Figure 3B:
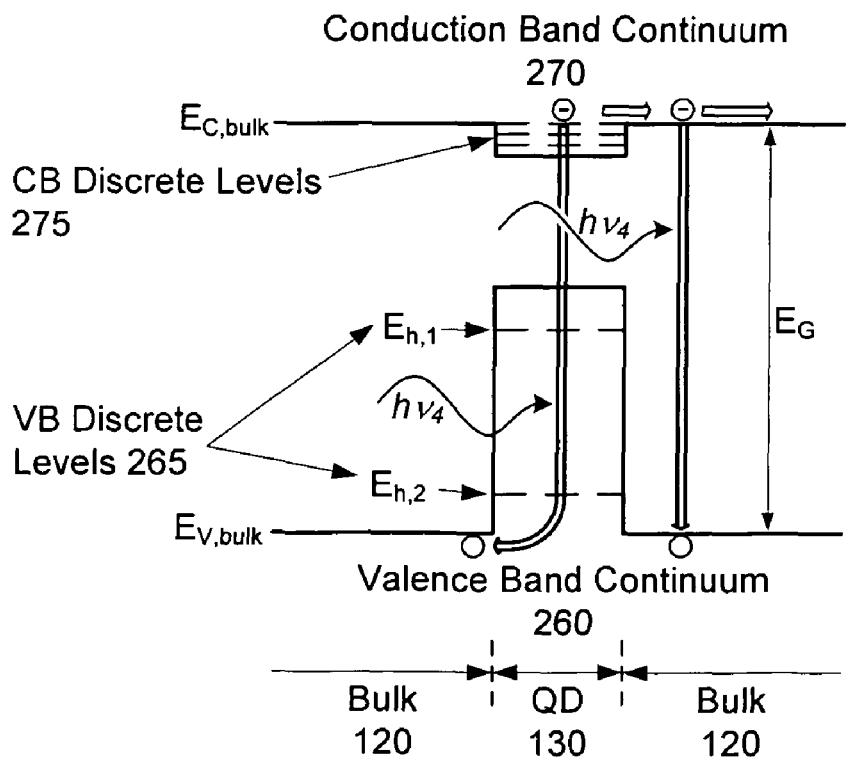

In FIGS. 3A and 3B, the highest quantum state ($E_{h,1}$) in the valence band provides the intermediate band 280. Absorption of a first photon having energy $hv_1$ increases the energy of an electron having an energy $E_{h,1}$ by $E_H$, exciting the electron from the valence band side of the band gap into the conduction band, thereby creating an electron-hole pair. Conceptually, this can be thought of as exciting a hole in the conduction band by $E_H$, thereby moving the hole into the $E_{h,1}$ quantum state. Absorption of a second photon having energy $hv_2$ increases the potential energy of the hole by $E_L$, exciting the electron from the ground state $E_{h,1}$ of the quantum dot to the valence-band edge of the bulk semiconductor 120, whereupon the hole is free to contribute to photocurrent.

Figure 4:
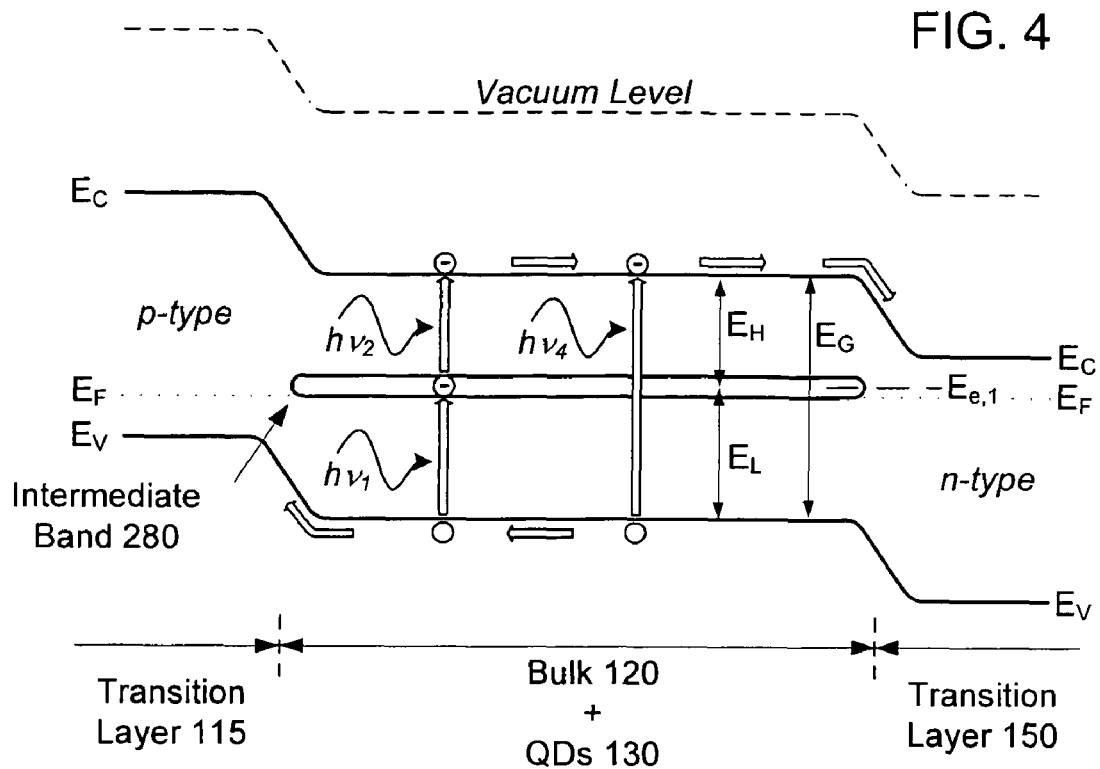
FIG. 4 is an energy band diagram for the intermediate band solar cell of FIG. 1, with inorganic quantum dots in an inorganic matrix material, and with the lowest quantum state in the conduction band providing the intermediate band.

FIG. 4 illustrates an energy band diagram for the intermediate-band device, using an array of dots having the profile demonstrated in FIGS. 2A and 2B. The aggregate of the overlapping wave functions of the $E_{e,1}$ energy state between adjacent quantum dots provides the intermediate band 280 between the conduction band edge ($E_C$) and the valence band edge ($E_V$) of the bulk matrix semiconductor 120. As in the same device if the quantum dots were omitted, absorption of photons of energy $hv_4$ generates electron-hole pairs, thereby producing photocurrent. The intermediate band 280 allows the absorption of two sub-band gap photons $hv_1$ and $hv_2$, leading to the creation of additional photocurrent. In FIG. 4, the transition layers 115 and 150 are arranged to create rectification.

FIG. 5 illustrates a cross-section of the device including an array of spherical quantum dots. In practice, the actual shape of the dots depends upon the choice of fabrication techniques. For example, inorganic quantum dots can be formed as semiconductor nanocrystallites in a colloidal solution, such as the "sol-gel" process known in the art. With some other arrangements, even if the actual dots are not true spheres, spheres may nonetheless provide an accurate model.

For example, an epitaxial method that has been successful in the creation of inorganic quantum dots in an inorganic matrix is the Stranski-Krastanow method (sometimes spelled Stransky-Krastanow in the literature). This method efficiently creates a lattice-mismatch strain between the dots and the bulk matrix while minimizing lattice damage and defects. Stranski-Krastanow is sometimes referred to as the "self-assembled quantum dot" (SAQD) technique.

The self-assembled quantum dots appear spontaneously, substantially without defects, during crystal growth with metal-organic chemical vapor deposition (MOCVD) or molecular beam epitaxy (MBE). Using growth conditions of the Stranski-Krastanow method, it is possible to create arrays and stacks of tiny dots (~10 nm), self-ordered, with both high areal density (>$10^{11}$ cm$^{-2}$) and optical quality. Self-ordered quantum dot (SOQD) techniques are able to create a three-dimensional quasi-crystal made up of a high density of defect-free quantum dots where radiative recombination is dominant.

FIG. 6 illustrates a cross-section of an intermediate-band device as fabricated by the Stranski-Krastanow method. A wetting layer 132 (e.g., one monolayer) is formed on the bulk matrix material 130. The material (e.g., InAs) used to form the wetting layer 132 has an intrinsic lattice spacing that is different from the bulk material (e.g., GaAs), but is grown as a strained layer aligned with the bulk lattice. Thereafter, spontaneous nucleation (~1.5 monolayers) seeds the dots, followed by dot growth, resulting in quantum dot layers 131. Bulk 121 overgrowth (over the dots layers 131) is substantially defect free. The wetting layer between the dots, having a thickness which remains unchanged during dot formation, does not appreciably contribute to the electrical and optical properties of the device, such that the dots produced by the Stranski-Krastanov method are often illustrated as idealized spheres like those illustrated in FIG. 5 in the literature. (The wetting layer between the dots is not considered a "connection" between the dots).

For additional background on inorganic intermediate-band quantum dot devices and fabrication, see A. Marti et al., "Design constraints of quantum-dot intermediate band solar cell," Physica E 14, 150-157 (2002); A. Luque, et al., "Progress towards the practical implementation of the intermediate band solar cell," Conference Record of the Twenty-Ninth IEEE Photovoltaic Specialists Conference, 1190-1193 (2002); A. Marti et al., "Partial Filling of a Quantum Dot Intermediate Band for Solar Cells," IEEE Transactions on Electron Devices, 48, 2394-2399 (2001); Y. Ebiko et al., "Island Size Scaling in InAs/GaAs Self-Assembled Quantum Dots," Physical Review Letters 80, 2650-2653 (1998); and U.S. Pat. No. 6,583,436 B2 to Petroff et al. (Jun. 24, 2003); each of which is incorporated herein by reference for its description of state of the art.

Quantum dot intermediate band solar cells have been actively investigated in recent years since it has been asserted that such cells have the potential for realizing solar power conversion efficiencies>60%. See A. Luque and A. Marti, Phys. Rev. Lett. 78, 5014(1997). Indeed, low band gap energy quantum dots can generate multiple electron-hole pairs (excitons) by absorption of a single high-energy photon, leading, in principle, to quantum efficiencies in excess of 100%. See R. D. Schaller and V. I. Klimov, Phys. Rev. Lett. 92, 186601-1(2004); and G. S. Philippe, Nature Mater. 4, 653(2005). To expand the spectral response to longer wavelengths, narrow band gap quantum dots (e.g. InAs) need to be packed sufficiently close to form an intermediate energy band within the gap of the host matrix material (e.g. GaAs).

However, the high concentration of strained quantum dots introduces a high charge density (~$1\times10^{16}$ cm$^{-3}$—see R. Wetzler, A. Wacker, E. Schll, C. M. A. Kapteyn, R. Heitz and D. Bimberg, Appl. Phys. Lett. 77, 1671(2000)) in the dot region, and photoexcited carriers (electron and hole) are rapidly captured by the self-assembled quantum dots. Consequently, the very high efficiencies predicted for quantum dot intermediate band solar cells have not been realized, due in part to non-ideal band structures that result in charge trapping followed by recombination of the photocarriers in the dots. In contrast to laser applications where fast carrier trapping is required (see L. V. Asryan and R. A. Suris, Semicond. Sci. Technol. 11, 554 (1996)), photogenerated carriers must tunnel through, or be transported around the quantum dots to avoid trapping and recombination at these sites.

Theoretical models (see V. Aroutiounian, S. Petrosyan and A. Khachatryan, Solar Energy Mater. & Solar Cells 89, 165 (2005)) confirm that for relatively short recombination times (~2 ns), quantum dots act primarily as recombination rather than as generation centers, resulting in a decrease in photocurrent with an increase in the number (N) of quantum dot layers within the larger bandgap semiconductor host. Partial filling of confined states in the dot region of intermediate band solar cells by Si δ-doping (see A. Martí, N. López, E. Antolín, C. Stanley, C. Farmer, L. Cuadra and A. Luque, Thin Solid Films 511, 638 (2006)) of the host has shown limited success. Although these devices have photoresponse extended to longer wavelengths, they also exhibit a significantly reduced open circuit voltage ($V_{oc}$) compared to large bandgap homojunction cells.

Indeed, no improvement in power conversion efficiency over a homojunction GaAs cell has yet been reported.

While formation of an intermediate band improves device performance, the results have failed to approach the expected theoretical improvement in photocurrent. Power efficiencies>60% have been predicted for idealized quantum dot intermediate band solar cells. This goal has not yet been realized, due in part to non-idealities that result in charge trapping followed by recombination of photocarriers in the quantum dots, and the lack of an optimal materials combination.

Figure 7:
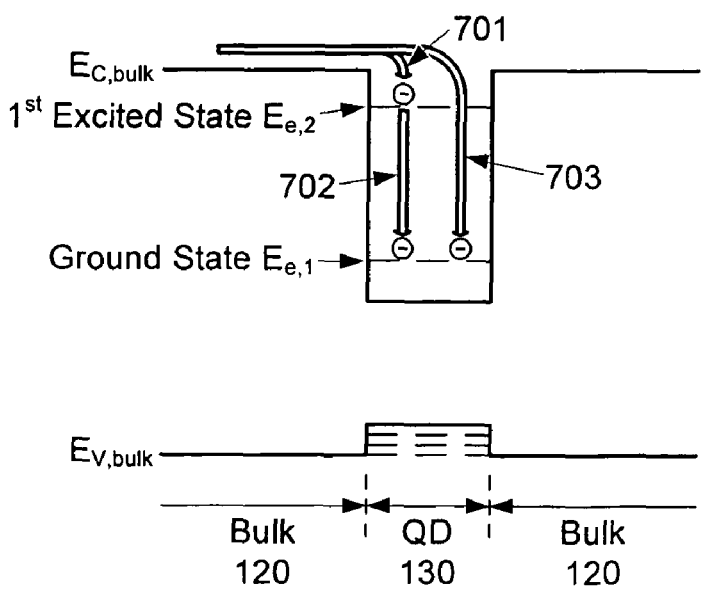
FIG. 7 is an energy band diagram for a cross-section of an inorganic quantum dot in an inorganic matrix material, illustrating de-excitation and trapping of a passing electron.

FIG. 7 illustrates a free electron being trapped by the quantum dot 130 when the charge carrier decays to an excited state $E_{e,2}$ (701) or to the ground state $E_{e,1}$ (702, 703). This deexcitation process reduces photocurrent as the energy is absorbed into the lattice as phonons. Similar carrier deexcitation and trapping also happens with holes. Accordingly, to improve the performance of intermediate-band solar cells, there is a need to reduce charge carrier de-excitation due to charge trapping.

A solution for reducing de-excitation trapping is to encapsulate each quantum dot in a thin barrier shell to require carriers to perform quantum mechanical tunneling to enter the dot. In classical mechanics, when an electron impinges a barrier of higher potential, it is completely confined by the potential "wall." In quantum mechanics, the electron can be represented by its wave function. The wave function does not terminate abruptly at a wall of finite potential height, and it can penetrate through the barrier. These same principles also apply to holes. The probability $T_t$ of an electron or hole tunneling through a barrier of finite height is not zero, and can be determined by solving the Schrödinger equation. In accordance with $T_t$, electrons or holes impinging a barrier simply reappear on the other side of the barrier. For additional background discussion on the phenomena of quantum mechanical tunneling and the Schrödinger equation, see the discussion below with FIGS. 14-17, as well as Robert F. Pierret, "Modular Series On Solid State Devices Volume VI, Advanced Semiconductor Fundamentals," *Chapter 2, Elements of Quantum Mechanics,* 25-51, Addison-Wesley Publishing (1989); and Kwok K. Ng, "Complete Guide to Semiconductor Devices," 2 d ed., *Appendix B8, Tunneling,* 625-627, Wiley-Interscience (2002). These sections of Pierret and Ng are incorporated herein by reference for their background explanation.

Figure 8:
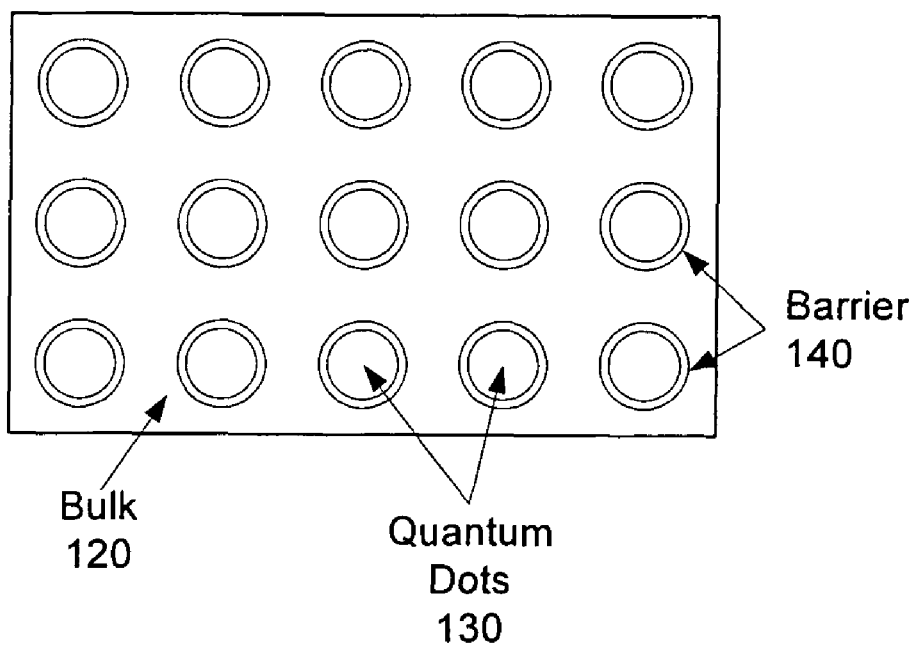
FIG. 8 illustrates a cross-section of an array of quantum dots like that shown in FIG. 5, modified to include a tunneling barrier.

FIG. 8 is a generalized cross-section of the array of quantum dots, each quantum dot modified to include a tunneling barrier 140.

Figures 9A, 9B:
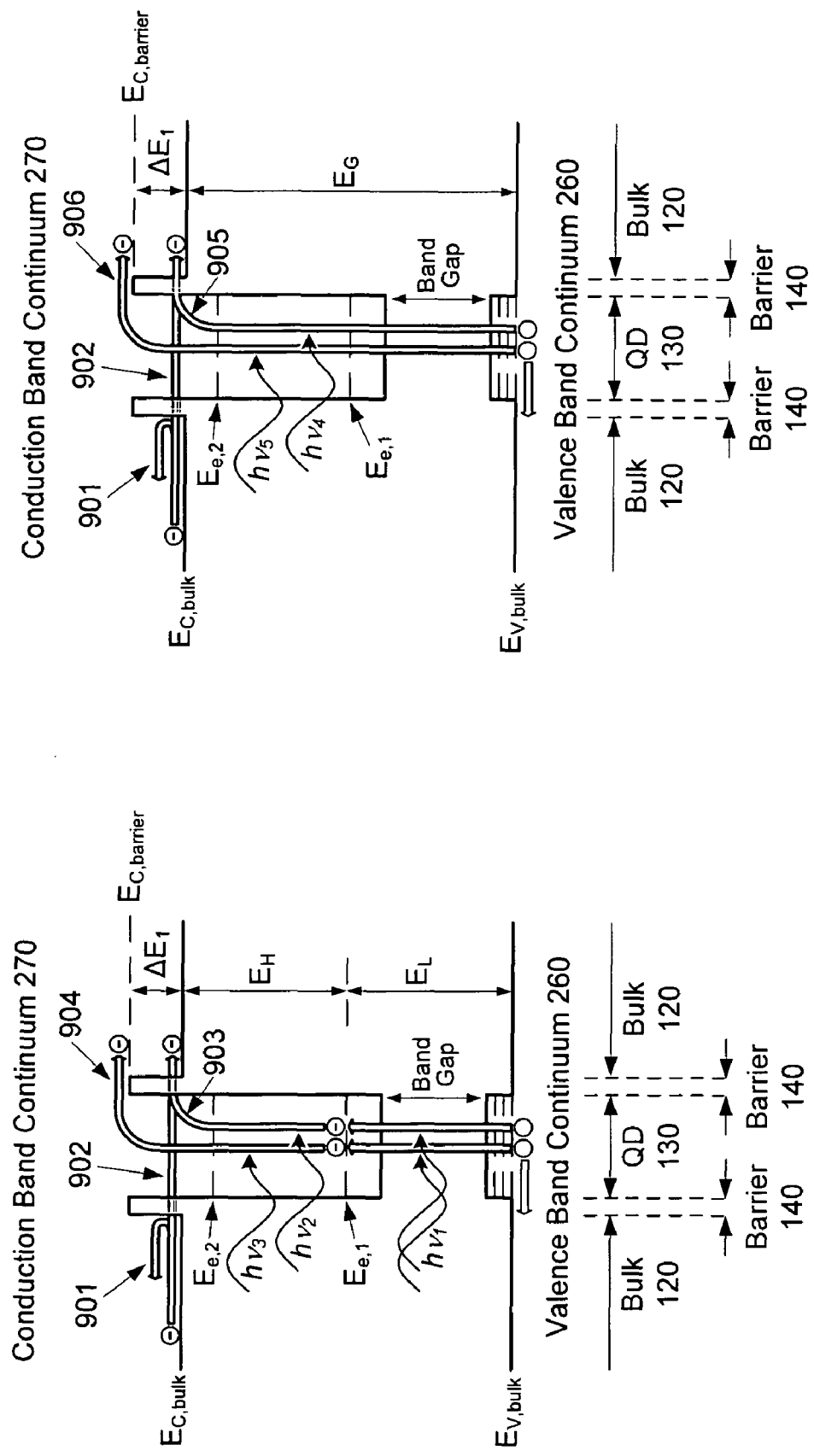
FIGS. 9A and 9B are energy-band diagrams for a cross-section of a quantum dot including tunneling barriers with a lowest quantum state above the band gap providing the intermediate band.

FIGS. 9A and 9B are energy band diagrams demonstrating a quantum dot modified to include a tunneling barrier 140 and having a quantum state above the band gap as the intermediate band 280. Some free electrons will be repelled (901) by the tunneling barrier. Such electrons are still available to contribute to photocurrent. Some free electrons will tunnel through the tunneling barrier (902) into and then out of the dot.

If the barrier 140 is viewed in the abstract, the probability that a free electron will tunnel through it is the same from either side of the barrier. For example, if a barrier presents a tunneling probability ($T_t$) of 0.5, there is a 50% chance that an electron (having an energy E) impinging on the barrier will tunnel. However, the small area of confinement within the quantum dot itself results in a much higher likelihood that an individual electron will escape before the relaxation and/or de-excitation cause the electron to fall to a lower energy state, since an electron having the energy of $E_{C,bulk}$ or higher is continually impinging upon the barrier due to spatial confinement.

Electrons below the band gap within the dot are excited into a first quantum state (e.g., $E_{e,1}$) providing the intermediate band, by photons having energy $hv_1$. From the intermediate band, a photon having energy $hv_2$ may excite an electron to an energy where it will tunnel through (903) the tunneling barrier 140 to the $E_{C,bulk}$ energy level of the bulk matrix material 120. In addition, a photon having an energy $hv_3$ may excite an electron over (904) the barrier 140. Electrons excited over the barrier have an excess energy of $\Delta E_1$. This excess energy $\Delta E_1$ is quickly lost as the electrons excited over the barrier decay to $E_{C,bulk}$ energy level. This loss of excess energy is relatively minor in comparison to the energy lost to trapping without the tunneling barriers 140, and in general, occurs before the electron can be trapped by an adjacent dot (i.e., entering an adjacent dot over, rather than through, the tunneling barrier 140).

A photon of energy $hv_4$ may excite an electron directly from the $E_{V,bulk}$ energy level to an energy level where it tunnels through (905) the tunneling barrier 140 into the $E_{C,bulk}$ energy level of the bulk matrix material 120. Further, a photon having an energy $hv_5$ may excite an electron directly from the $E_{V,bulk}$ energy level over (906) the barrier 140.

In order to further minimize the probability that a free electron passing (902) into and out of the dot will experience deexcitation, it is preferred that a second quantum state (e.g., $E_{e,2}$) is substantially equal to the $E_{C,bulk}$ energy level of the bulk material. Specifically, the second quantum state is preferably within ±5 kT of the $E_{C,bulk}$ energy level (k being the Boltzmann contant and T being the operating temperature), thereby creating an overlap between the second quantum state and the $E_{C,bulk}$ energy level. A free electron, if entering a dot at an energy corresponding to a forbidden level within the dot is statistically more likely to be trapped due to deexcitation; by positioning the second quantum state in the dot within ±5 kT of the $E_{C,bulk}$ energy level, the probability of trapping decreases.

Operating temperatures for inorganic photosensitive devices are commonly specified as having a range of T=-40° C. to +100° C. Thus, using +100° C. as a maximum limit and solving for ±5 kT (i.e., 5×1.3806505E−23(J/K)/1.602E-19(J/eV)×(7° C.+273.15)° K), the second quantum state should be within ±0.16 eV of the conduction band edge of the bulk matrix material 120.

Figure 10:
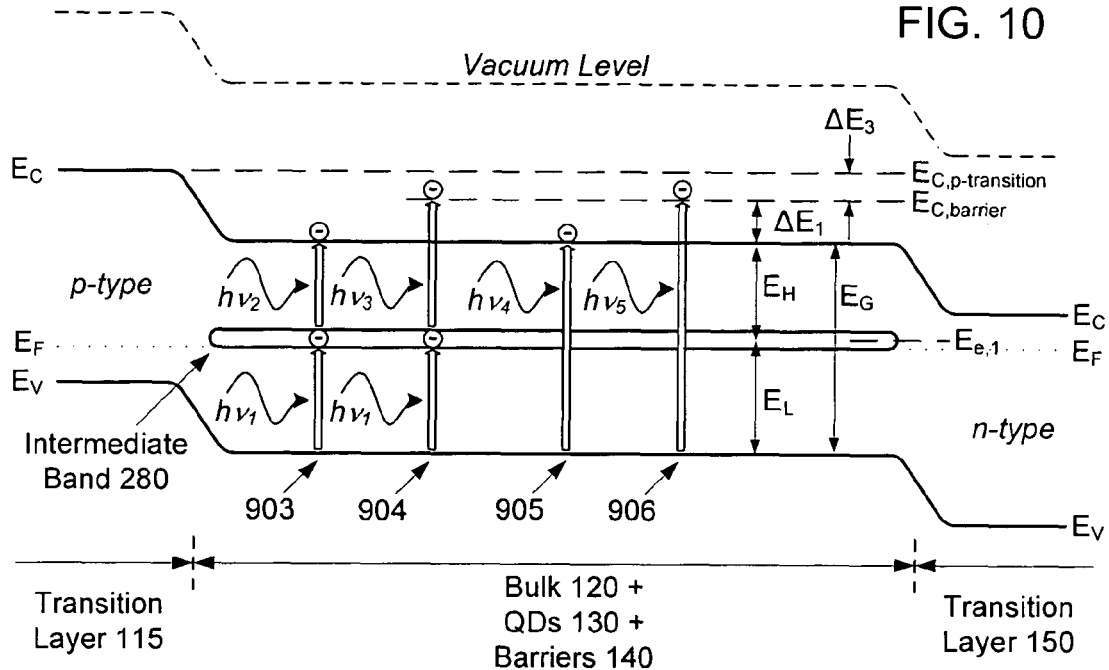
FIGS. 10 is an energy band diagram for a solar cell based on the design in FIG. 1, with quantum dots modified to include the tunneling barrier, and with the lowest quantum state above the band gap providing the intermediate band.

FIG. 10 is an energy band diagram for a device using the quantum dots from FIGS. 9A and 9B. The transition layers 115 and 150 are arranged to create rectification, thereby controlling the direction of current flow. Depending on the relative proximity between the quantum dots and the transition layer 115 and the time it takes for an electron that escapes a dot over the barrier 140 (904 or 906) to decay to $E_{C,bulk}$ energy level, it is possible that for some configurations, an electron that escapes a dot over the barrier 140 might have sufficient energy to create a reverse current flow into the transition layer 115. Therefore, depending upon proximity and decay times, consideration should be given to $\Delta E_3$, which is the difference between the conduction band edge ($E_{C,p\text{-}transition}$) of transition layer 115 and the conduction band edge ($E_{C,barrier}$) peak of the tunneling barrier 140. To maintain rectification at the interface with the transition layer 115, the $E_{C,p\text{-}transition}$ band gap edge of the p-type transition layer 115 is preferably greater than a conduction band peak of the tunneling barriers ($E_{C,barrier}$).

Figures 11A, 11B:
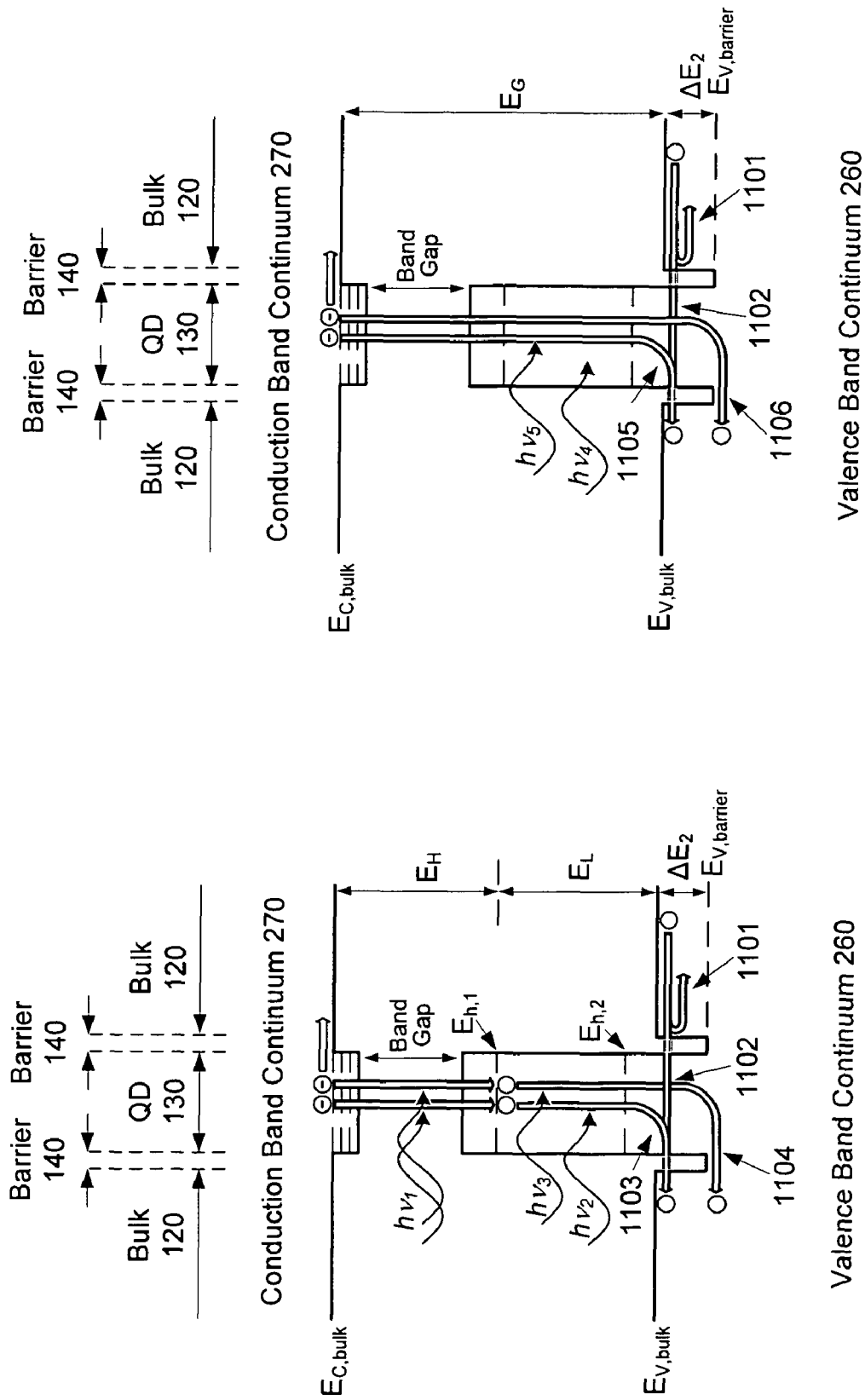
FIGS. 11A and 11B are energy-band diagrams for a cross-section of a quantum dot including tunneling barriers with a highest quantum state below the band gap providing the intermediate band.

FIGS. 11A and 11B are energy band diagrams demonstrating a quantum dot modified to include a tunneling barrier 140 and having a quantum state below the band gap as the intermediate band 280. Some holes will be repelled (1101) by the tunneling barrier. Such holes are still available to contribute to photocurrent. Some holes will tunnel through the tunneling barrier (1102) into and then out of the dot.

As with the electron example discussed above, the small area of confinement within the quantum dot itself results in a much higher likelihood that an individual hole will escape before the relaxation and/or de-excitation cause the hole to "fall" to a higher energy state, since a hole having the energy of $E_{V,bulk}$ or lower is continually impinging upon the barrier due to spatial confinement.

Holes above the band gap within the dot are excited into a first quantum state (e.g., $E_{h,1}$), providing the intermediate band, by photons having energy $hv_1$ (As with the concept discussed above with FIGS. 3A and 3B, excitation of hole in the conduction band is conceptually interchangeable with the generation of an electron-hole pair in the intermediate band, with the electron being excited into the conduction band and the hole being left behind in the intermediate band). From the intermediate band, a photon having energy $hv_2$ may excite the hole to an energy where it will tunnel through (1103) the tunneling barrier 140 into the $E_{V,bulk}$ energy level of the bulk matrix material 120. In addition, a photon having an energy $hv_3$ may excite a hole over (1104) the barrier 140 ("over" being used since holes fall up). Holes excited over the barrier have an excess energy of $\Delta E_2$. This excess energy $\Delta E_2$ is quickly lost as the holes excited over the barrier decay to the $E_{V,bulk}$ energy level. This loss of excess energy is relatively minor, in comparison to the energy lost to trapping without the tunneling barriers 140, and in general, occurs before the hole can be trapped by an adjacent dot (i.e., entering an adjacent dot over, rather than through, the tunneling barrier 140).

A photon of energy $hv_4$ may excite a hole directly from the $E_{C,bulk}$ energy level to an energy level where it tunnels through (1105) the tunneling barrier 140 into the $E_{V,bulk}$ energy level of the bulk matrix material 120. Further, a photon having an energy $hv_5$ may excite a hole directly from the $E_{C,bulk}$ energy level over (1106) the barrier 140.

In order to further minimize the probability that a hole passing (1102) into and out of the dot will experience deexcitation, it is preferred that a second quantum state (e.g., $E_{h,2}$) of the valence band of the quantum dot is substantially equal to the $E_{V,bulk}$ energy level of the bulk material. Specifically, the second quantum state should be within ±5 kT of the $E_{V,bulk}$ energy level of the bulk material, thereby creating an overlap between the second quantum state and the $E_{V,bulk}$ energy level. A hole, if entering a dot at an energy corresponding to a forbidden level within the dot is statistically more likely to be trapped due to deexcitation; by positioning the second quantum state in the dot within ±5 kT of the $E_{V,bulk}$ energy level, the probability of trapping decreases.

Figure 12:
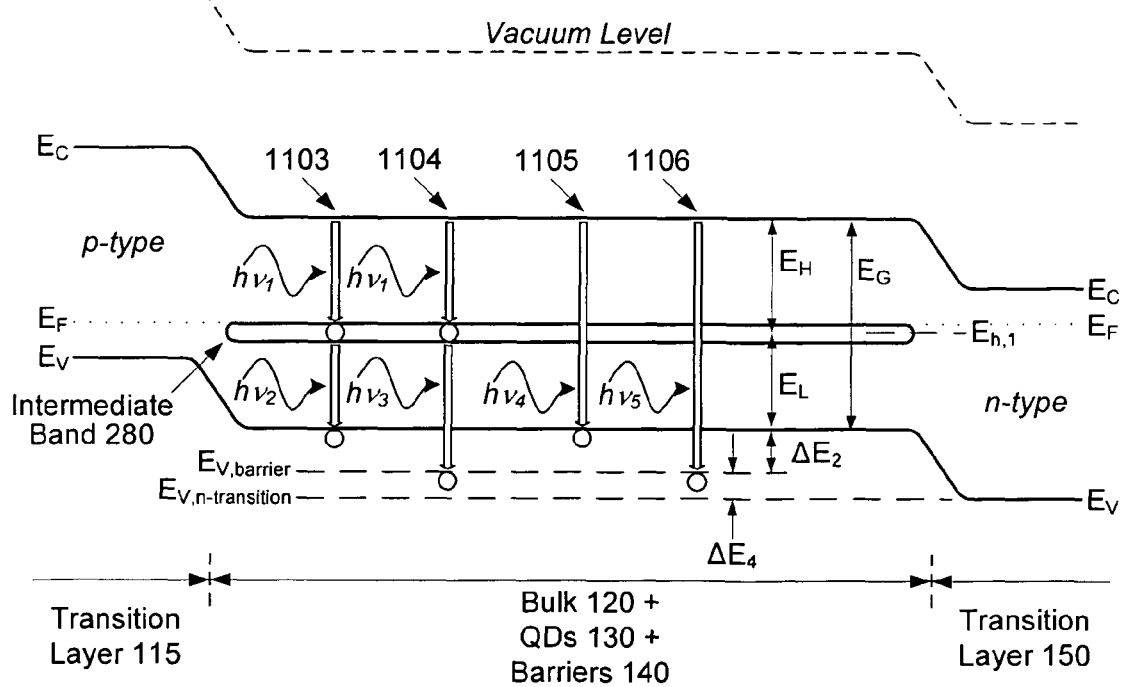
FIG. 12 is an energy band diagram for a solar cell based on the design in FIG. 1, with quantum modified to include the tunneling barrier, and with the highest quantum state below the band gap providing the intermediate band.

FIG. 12 is an energy band diagram for a device using the quantum dots from FIGS. 11A and 11B. The transition layers 115 and 150 are again arranged to create rectification, thereby controlling the direction of current flow. Depending up the relative proximity between the quantum dots and the transition layer 150 and the time it takes for a hole that escapes a dot over the barrier 140 (1104 or 1106) to decay to $E_{V,bulk}$ energy level, it is possible that for some configurations, a hole that escapes a dot over the barrier 140 might have sufficient energy to create a reverse current flow into the n-type transition layer 150. Therefore, depending upon proximity and decay times, consideration should be given to $\Delta E_4$, which is the difference between the valence band edge ($E_{V,n\text{-}transition}$) of transition layer 150 and the valence band edge ($E_{V,barrier}$) peak of the tunneling barrier 140. To maintain rectification at the interface with the transition layer 150, the $E_{V,n\text{-}transition}$ band gap edge of the transition layer 150 is preferably lower than a valence band peak of the tunneling barriers ($E_{V,barrier}$).

As used herein, the "peak" of a barrier for tunneling electrons is the highest energy edge of the $E_{C,barrier}$ of the barrier, whereas the "base" is commensurate with the $E_{C,bulk}$ energy level in the bulk matrix material at the interface with the barrier. The "peak" of a barrier for tunneling holes is the lowest energy edge of the $E_{V,barrier}$ of the barrier, whereas the "base" is commensurate with the $E_{V,bulk}$ energy level in the bulk matrix material at the interface with the barrier.

A characteristic of inorganic quantum dots that bears explaining and is apparent in FIGS. 9A and 9B is that in an inorganic quantum dot, the $E_{e,1}$ quantum state may or may not correspond the conduction band edge (top of the band gap) of the quantum dot material. It is customary to illustrate the band gap of the dot material as though it were a bulk material, even if the band-gap edges of the material as arranged within the quantum dot are not "allowed" quantum states. The positions of allowed quantum states within an inorganic quantum dot are dependent on wave functions. As is known in the art, the position of the wave functions/quantum states can be engineered. As illustrated in FIGS. 9A and 9B, this may results in the $E_{e,1}$ quantum state being positioned away from the band gap edge. In other words, the band gap edge in an inorganic quantum dot may not necessarily be an allowed quantum state. These characteristics also apply to the valence-band side of inorganic quantum dots (i.e., $E_{h,1}$ in FIGS. 11A and 11B).

A characteristic of the inorganic bulk matrix material 120 may include the formation of a valence band continuum 260 and conduction band continuum 270 above and below the band gap edges of the inorganic bulk matrix material. These continuums are, in essence, a cloud of energy states, with a density of states decreasing with distance from the band gap edge. The presence of the continuums means that a charge carrier escaping a dot over a tunneling barrier may exit the dot into an allowed energy state, which is a consideration when determining how quickly the carrier will fall toward the band gap. For a typical density of states in a band continuum, the deexcitation loss of excess energy ($\Delta E_1$, $\Delta E_2$) is still likely to occur before the free electron can be trapped by an adjacent dot (i.e., entering an adjacent dot over, rather than through, the tunneling barrier 140).

For an inorganic dot in an inorganic matrix without a barrier layer (e.g., FIGS. 2 and 3), the band continuums 270, 260 over the dot essentially begin at $E_{C,bulk}$ and $E_{V,bulk}$, respectively. In comparison, the presence of the barrier 140 may push the continuum 270 higher directly over the dot in FIGS. 9A and 9B, and may push the continuum 260 lower directly below the dot in FIG. 11A and 11B.

Figure 13:
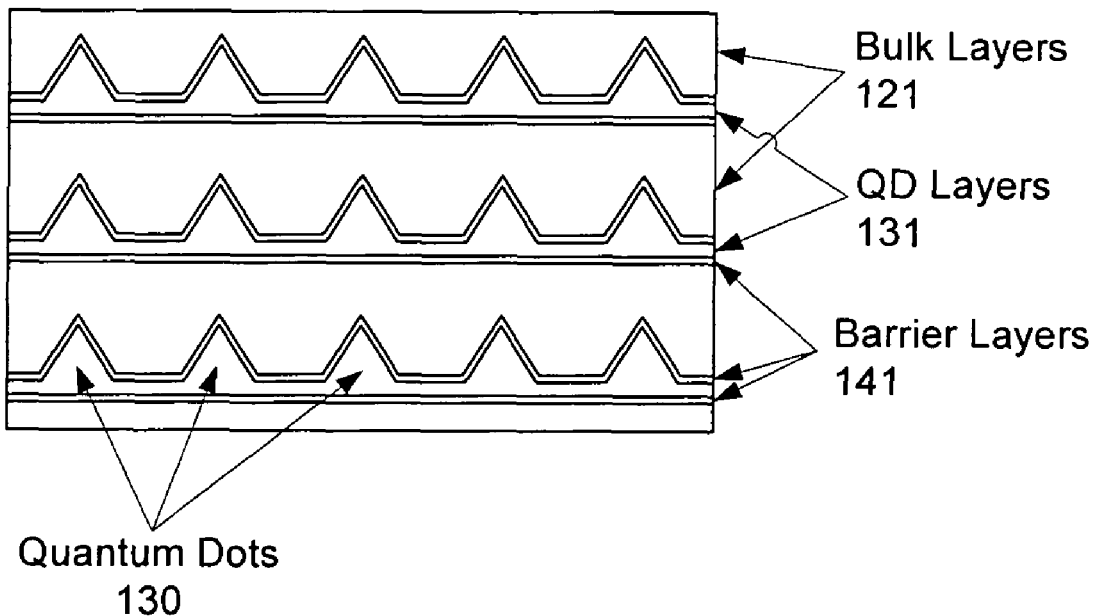
FIG. 13 illustrates a cross-section of the array of quantum dots modified to include the tunneling barrier, if produced using the Stranski-Krastanow method.

FIG. 13 is a cross-section of an array of quantum dots based on the device in FIG. 1, if produced using the Stranski-Krastanow method and modified to include the tunneling barrier 140. A thin (e.g., at least one monolayer; for example, 0.1 to 10 nm) barrier layer 141 is grown (e.g., MBE, MOCVD), prior to deposition of the wetting layer 132. Then, after growth of the quantum dots 130, another barrier layer 141 is grown, thereby encapsulating each dot.

Preferably, the barrier layers 140, 141 are lattice-matched to the bulk matrix material 120, 121. A mismatch in strain between the bulk material and the barrier material increases the potential for defects. For example, a mismatch may result in an inconsistent lattice spacing within the barrier layer if the thickness of a thin barrier layer varies in places by as little as a monolayer, creating variations during the spontaneous nucleation that seeds the dots. Accordingly, lattice matching the barrier to the bulk matrix minimizes the chances of inhomogenieties between successive quantum dot layers and adjacent dots. However, so long as a lattice mismatch between the bulk and the barrier does not induce defects, a small mismatch in lattice constants "α" (e.g., $|\Delta\alpha/\alpha|<1\%$) can be tolerated.

The devices described with FIGS. 8-13 may be achieved using several different material-type combinations.

For any of the inorganic quantum dots 130, 131 and inorganic bulk matrix materials 120, 121, examples of inorganic semiconductor materials include III-V compound semiconductors such as AlAs, AlSb, AlP, AlN, GaAs, GaSb, GaP, GaN, InAs, InSb, InP, and InN; II-VI compound semiconductors such as CdS, CdSe, CdTe, ZnO, ZnS, ZnSe, and ZnTe; other compound semiconductors such as PbS, PbSe, PbTe, and SiC; and the ternary and quaternary alloys of such compound semiconductors.

Figure 32:
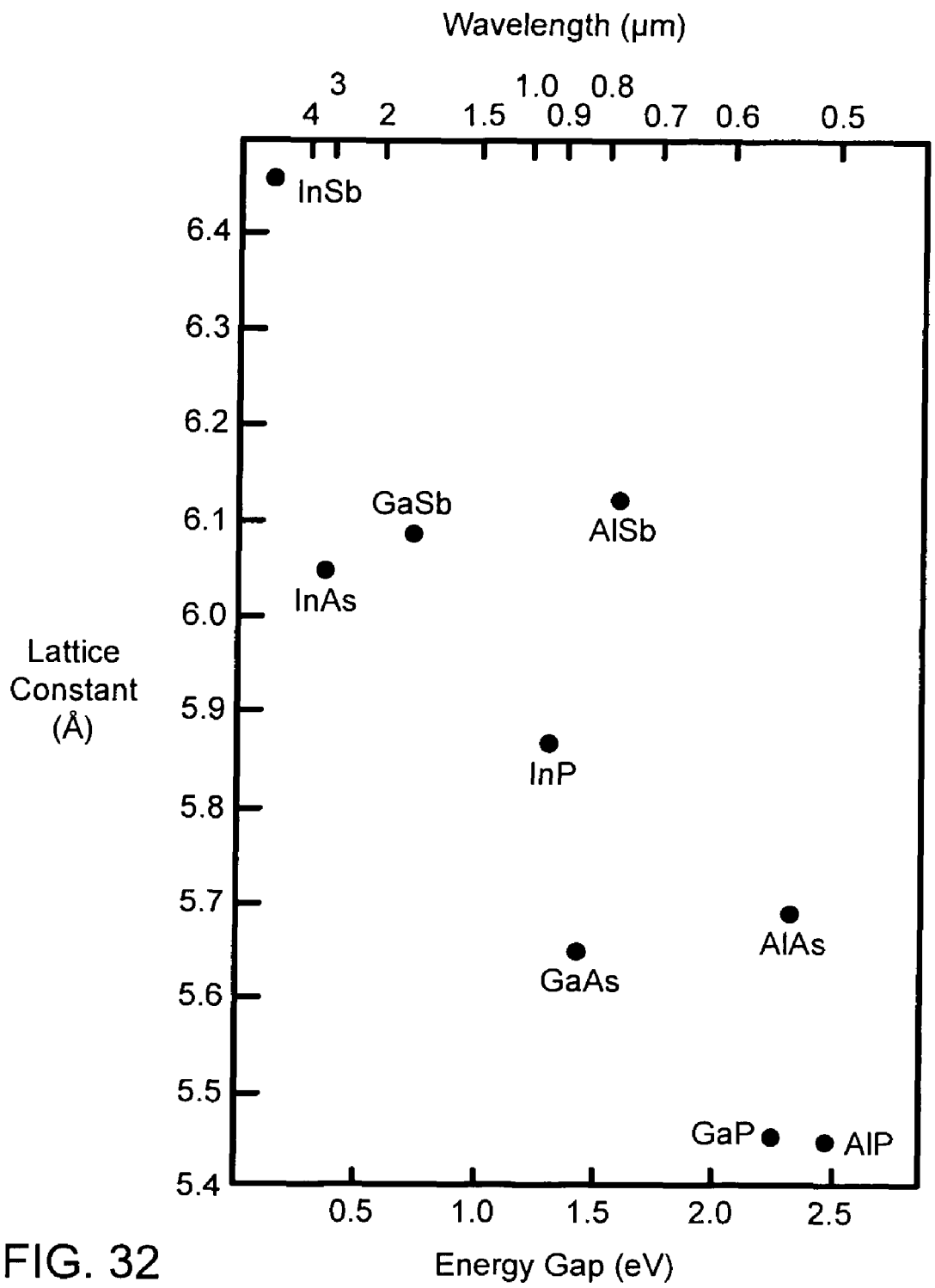
FIG. 32 illustrates the relationship between lattice constant, peak absorption wavelength, and energy gap for a variety of common compound semiconductors. Ternary and quaternary combinations of these semiconductors (in between the points shown) provide lattice matched materials having different energy gaps.

For any of the inorganic tunneling barriers 140, 141, examples of materials include the aforementioned inorganic semiconductor materials, as well as insulators such as oxides, nitrides, or oxynitrides. How to select materials having appropriate relative energies and how to select materials that lattice-match are well known in the art. FIG. 32 illustrates lattice constants, wavelengths, and energy gaps for a variety III-V compound semiconductors. As is known in the art, ternary and quaternary alloys of these compounds can be grown to lattice match binary III-V compounds. For example, the ternary compound $Al_xGa_{1-x}As$ can be grown to very closely lattice match GaAs (within approximately 0.1%) for most any value of x. Similarly, the quaternary compound $Ga_xIn_{1-x}As_{1-y}P_y$ can be lattice matched to both GaAs and InP by adjusting x and y (e.g., $Ga_{0.8}In_{0.2}As_{0.65}P_{0.35}$ lattice matches InP). As yet another example, $Al_{0.48}In_{0.52}As$ lattice matches InP. Moreover, ternary and quaternary compounds can be lattice matched to each other. The lattice constants (α) for alloys can be calculated from Vegard's law, which gives a value equal to the weighted average of the constituent binaries. For example, for $Ga_xIn_{1-x}As_yP_{1-y}$, $\alpha(x,y)=xy\alpha_{GaAs}+x(1-y)\alpha_{GaP}+(1-x)y\alpha_{InAs}+(1-x)(1-y)\alpha_{InP}$.

An approximation of bandgap for alloys can be interpolated in similar fashion.

FIGS. 14-17 further demonstrate the principles of quantum mechanical tunneling. The explanation and equations below are based upon a discussion in "Complete Guide to Semiconductor Devices," 2d ed., by Kwok K. Ng, *Appendix B8, Tunneling*, 625-627, Wiley-Interscience (2002). The explanation and equations have been modified to, among other things, accommodate holes in addition to electrons. Also, although the effective mass of a charge carrier in the quantum dot material and in the barrier material does not usually change significantly, the equations are modified to use a reduced effective mass adjusted for the change.

Figure 14:
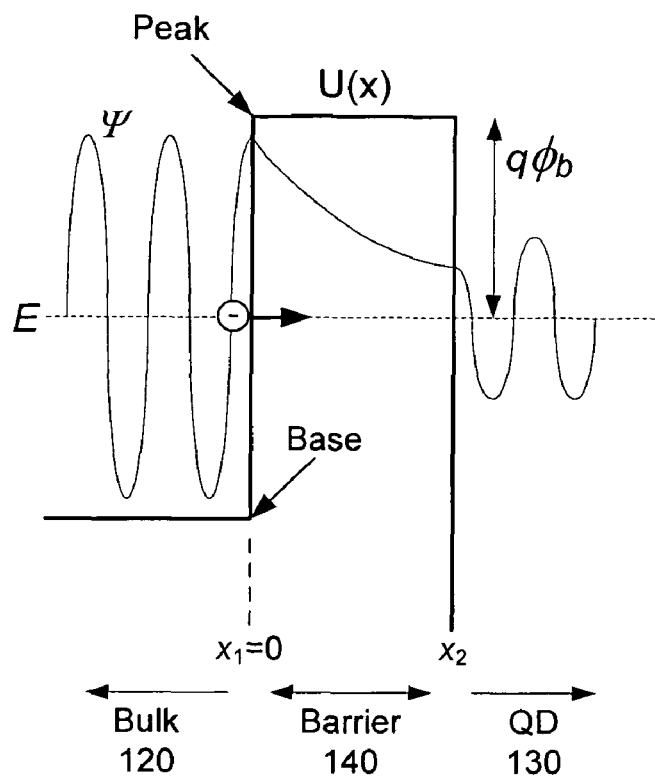
FIGS. 14 and 15 demonstrate tunneling through a rectangular barrier.

In general, without regard to whether organic and/or inorganic materials are used to build the photosensitive device, if the energy level E of a carrier relative to the barrier height is known, three parameters are required to determine the tunneling probability $T_t$ for the carrier: the absolute value of the difference between the peak of the tunneling barrier and the energy of the carrier ($\phi_b$), the thickness ($\Delta_x$) of the barrier at the energy level of the carrier, and the potential profile $U(x)$ of the barrier. The potential profile $U(x)$ of the barrier is sometimes referred to as the "shape" of the barrier. An example of an electron tunneling through a rectangular barrier is illustrated in FIG. 14.

As is known in the art, to calculate the tunneling probability $T_t$ for an electron, the wave function $\Psi$ has to be determined from the Schrödinger equation:

$$\frac{d^2\Psi}{dx} + \frac{2m_r^*}{\hbar^2}[E - U(x)]\Psi = 0 \quad (1)$$

where $m_r^*$ is the reduced effective mass of the charge carrier (in this case, an electron), h is the reduced Planck constant, and q is electron charge.

The reduced effective mass of the charge carrier is:

$$\frac{1}{m_r^*} = \frac{1}{m_{QD}^*} + \frac{1}{m_{barrier}^*} \quad (2)$$

where $m_{QD}^*$ is the effective mass of the charge carrier in the quantum dot, and $m_{barrier}^*$ is the effective mass of the charge carrier in the barrier material.

Since the potential profile $U(x)$ of the barrier does not vary rapidly, Equation (1) can be simplified using the Wentzel-Kramers-Brillouin approximation and integrated to determine the wave function:

$$\left|\frac{\Psi(x_2)}{\Psi(x_1)}\right| = \exp\left\{-\int_{x_1}^{x_2} \sqrt{\frac{2m_r^*}{\hbar^2}[U(x) - E]}\, dx\right\} \quad (3)$$

Since the probability of the electron's presence is proportional to the square of the wave function magnitude, the tunneling probability $T_t$ is given by:

$$T_t = \left|\frac{\Psi(x_2)}{\Psi(x_1)}\right|^2 = \exp\left\{-2\int_{x_1}^{x_2} \sqrt{\frac{2m_r^*}{\hbar^2}[U(x) - E]}\, dx\right\} \quad (4)$$

For the case of the rectangular barrier illustrated in FIG. 14, solving Equation (4) for the tunneling probability is given by:

$$T_t = \exp\left\{-2\sqrt{\frac{2m_r^* q\phi_b}{\hbar^2}}\Delta x\right\} \quad (5)$$

Figure 15:
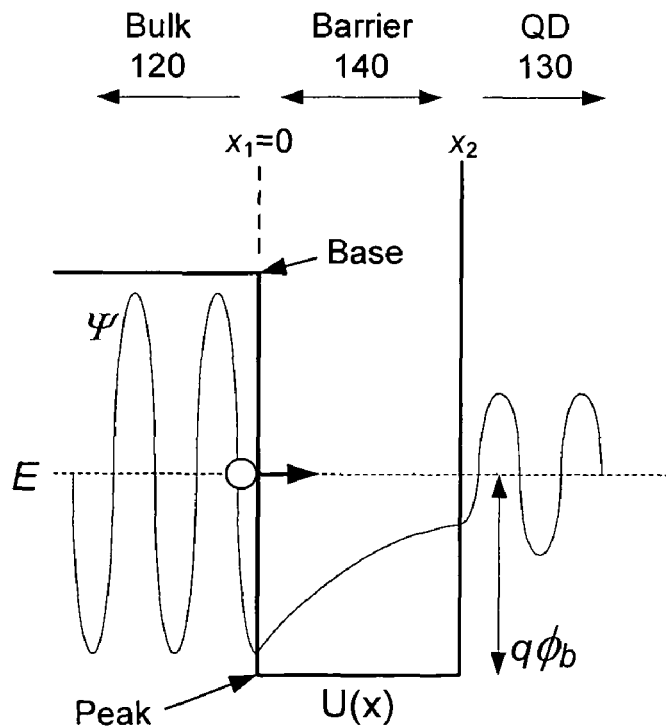

Adapting Equation (5) to also apply to hole tunneling, as illustrated in FIG. 15 (in addition to electron tunneling illustrated in FIG. 14) by taking the absolute value of $\phi_b$, and then rearranging the equation to solve for the thickness ($\Delta x$) of the barrier at the energy level of the carrier gives:

$$\Delta x = \frac{-\ln(T_t)\hbar}{2\sqrt{2m_r^* q|\phi_b|}} \quad (6)$$

where $m_r^*$ is the reduced effective mass of the charge carrier (electron or hole).

From a design point-of-view, the thickness $\Delta x$ of the barrier is preferably selected based on the energy level at the base of the tunneling barrier. If the bulk matrix is an inorganic material having the conduction band continuum 270 and valence band continuum 260, the density of states generally suggests that a charge carrier having the energy level at the base of barrier will be the dominant carrier energy.

If the energy E of the charge carrier equals the energy level at the base of the tunneling barrier, then $|\phi_b|$ equals the absolute value of the height of the barrier, which is the difference between the energy levels at the peak and the base of the tunneling barrier. These energy levels are physical characteristics of the materials used for the bulk matrix material 120 and the barrier material 140. For example, in FIG. 14, the barrier height equals the $E_{C,barrier}$ of the barrier material minus the $E_{C,bulk}$ of the bulk matrix material; in FIG. 15, the barrier height equals the $E_{V,barrier}$ of the barrier material minus the $E_{V,bulk}$ of the bulk matrix material. The effective mass of the charge carrier in the barrier material $m_{barrier}^*$ and in the quantum dot material $m_{QD}^*$ are also physical characteristics of the respective materials. Moreover, the thickness $\Delta x$ at the base of the tunneling barrier equals the physical thickness of the tunneling barrier layer 140, 141.

For example, if electrons are the tunneling charge carrier and approximating E as the energy level at the base of the barrier, Equation (6) can be expressed as:

$$\Delta x = \frac{-\ln(T_t)\hbar}{2\sqrt{2m_r^* q|E_{C,barrier} - E_{C,bulk}|}} \quad (6a)$$

Similarly, if holes tunnel through an inorganic barrier and approximating E as the energy level at the base of the barrier, Equation (6) can be expressed as:

$$\Delta x = \frac{-\ln(T_t)\hbar}{2\sqrt{2m_r^* q|E_{V,barrier} - E_{V,bulk}|}} \quad (6b)$$

Thus, if the materials are known, the preferred thickness $\Delta x$ of the barrier layer 140 can be determined for any tunneling probability $T_t$.

Absent substantial diffusion or other material intermixing at the boundaries of the tunneling barrier 140, the potential profile U(x) of the tunneling barrier can almost always be approximated as rectangular. Furthermore, for any combination of materials, the thickness needed for the barrier layer is directly proportional to the negative of the natural log of the tunneling probability in accordance with:

$$\Delta x \propto \frac{-\ln(T_t)\hbar}{\sqrt{2m_r^* q|\phi_b|}} \quad (7)$$

An equation to calculate barrier thickness can be derived for any function U(x). Without regard to the potential profile U(x) of the tunneling barrier, Equation (7) holds true. For example, FIG. 16 illustrates a triangular barrier and FIG. 17 illustrates a parabolic barrier.

Figure 16:
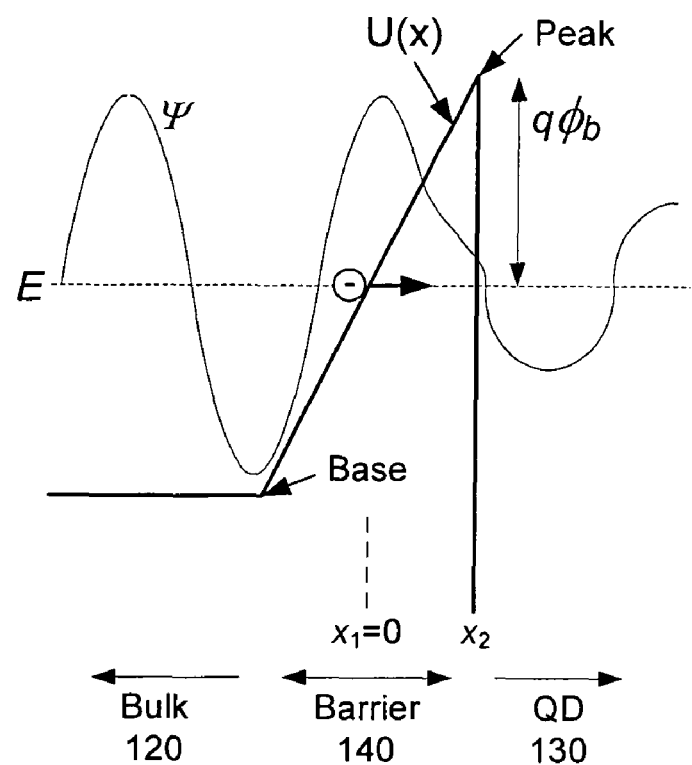
FIG. 16 demonstrates a triangular tunneling barrier.
Figure 17:
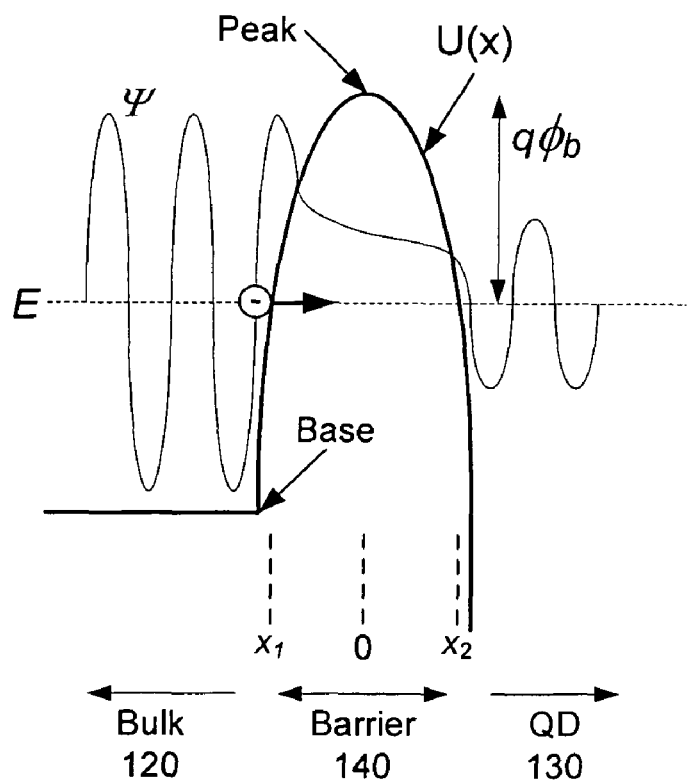
FIG. 17 demonstrates a parabolic tunneling barrier.

In FIG. 16, potential can be described by:

$$U(x) - E = q\phi_b\left(\frac{x}{\Delta x}\right) \quad (8)$$

Solving Equation (4) with Equation (8), the tunneling probability is given by:

$$T_t = \exp\left\{-\frac{4}{3}\sqrt{\frac{2m_r^* q\phi_b}{\hbar^2}}\Delta x\right\} \quad (9)$$

Adapting Equation (9) to also apply to hole tunneling by taking the absolute value of $\phi_b$, and then rearranging the equation to solve for the thickness ($\Delta x$) of the barrier at the energy level of the carrier gives:

$$\Delta x = \frac{-3\ln(T_t)\hbar}{4\sqrt{2m_r^* q|\phi_b|}} \quad (10)$$

In FIG. 17 potential can be described by:

$$U(x) - E = q\phi_b\left(1 - \frac{4x^2}{\Delta x^2}\right) \quad (11)$$

Solving Equation (4) with Equation (10), the tunneling probability is given by:

$$T_t = \exp\left\{-\frac{\pi}{2}\sqrt{\frac{2m_r^* q\phi_b}{\hbar^2}}\Delta x\right\} \quad (12)$$

Adapting Equation (12) to also apply to hole tunneling by taking the absolute value of $\phi_b$, and then rearranging the equation to solve for the thickness ($\Delta x$) of the barrier at the energy level of the carrier gives:

$$\Delta x = \frac{-2\ln(T_t)\hbar}{\pi\sqrt{2m_r^*q|\phi_b|}} \quad (13)$$

Thus, Equation (7) holds true, without regard to the potential profile U(x) of the barrier.

The tunneling probability $T_t$ for barrier 140 is preferably between 0.1 and 0.9. A more precise probability $T_t$ may be determined experimentally for any design by measuring the photocurrent output, thereby determining the efficiency to be gained. The more preferred range for $T_t$ is between 0.2 and 0.5.

There is a balance to be struck between barrier height and barrier thickness for any given tunneling probability $T_t$. It may seem that making the barrier lower would increase efficiency by lessening the energy lost to deexcitation of carriers that hop out of a dot over the barrier, rather than tunneling out. However, this introduces another inefficiency since the barrier layer would need to be thicker for a same tunneling probability $T_t$, reducing the volume-percentage of the device dedicated to generating photocurrent. Even if the barriers are made of photoconductive materials, they would not be expected to appreciably contribute to photocurrent generation (due to their relatively large band gap). The end result is that thicker barriers take up space that would otherwise be composed of photoconductive materials, lowering photocurrent generation and efficiency. Accordingly, the preferred thickness limit for a tunneling barrier is between 0.1 to 10 nanometers. Within the range of 0.1 to 10 nanometers, the thickness of the tunneling barrier is preferably no more than 10% of the average cross-sectional thickness of a quantum dot, through a center of a quantum dot.

Whether holes or electrons are being used as the tunneling charge carrier, it is generally preferable that the energy levels of the opposite side of the band gap not create a trap for the opposite carrier. For example, referring to FIGS. 9A and 9B, the $E_{V,barrier}$ of the barrier layer 140 is preferably within ±5 kT of the $E_{V,bulk}$ of the bulk matrix 120. This general ±5 kT difference is also preferred between $E_{C,barrier}$ and $E_{C,bulk}$ on the conduction band side of the quantum dots in FIGS. 11A and 11B. The quantum dot material may be chosen to minimize the depth of the potential "trap" for the opposite carrier. Additionally, an energy state within the potential "trap" for the opposite side of the band gap is preferably positioned to keep an outermost quantum state within the trap within ±5 kT of the energy levels of the adjacent barrier layers 140, somewhat improving the probability that a passing electron or hole will pass right by without deexcitation.

The number of energy levels shown in the drawings within the quantum dots are simply examples. On the tunneling side, while there are preferably at least two quantum states (one forming the intermediate band and one positioned to overlap the energy level of the adjacent bulk matrix material), there may only be a single quantum state providing the intermediate band. Likewise, although the intermediate band is preferably formed by the quantum states closest to the band gap, a higher order energy state could be used. So long as the wave functions between adjacent dots overlap, a deciding factor as to whether a quantum state can function as an intermediate band is whether the two wavelengths required to pump a carrier by $E_L$ and $E_H$ will be incident on the dots.

As a practical matter, a band cannot function as an intermediate band if two wavelengths needed to pump the carrier through the band will never be incident on the quantum dots. For example, if one of the wavelengths needed for pumping either $E_L$ or $E_H$ is absorbed by the bulk matrix material, the barrier material, etc., it will not be incident on the quantum dots, even if the wavelength is incident on the photosensitive device itself. For many materials, this same problem limits the practicality of inter-band pumping through two quantum states (e.g., pumping from the valence band to an $E_{e,1}$ state, then to an $E_{e,2}$ state, and then into the conduction band). In any case, the tunneling barrier 140 and bulk matrix material 120 need to be substantially transparent to photons having energy $E_L$ and $E_H$. Another consideration to balance in selecting materials is the efficiency and contribution to photocurrent of the transition of carriers directly across the bulk matrix band gap $E_G$ (without passing into the intermediate band) in both the bulk matrix 120 and in the dots 130 themselves.

Experimental

If a tunneling barrier 140 is added to dots 130 in, for instance, a colloidal solution, and the coated dots are interspersed within a bulk-material matrix, charge carriers in the bulk 120 can transit through the structure without necessarily tunneling through a barrier 140. However, if the dots are formed by the Stranski-Krastanow technique discussed above and illustrated in FIG. 13, carriers will tunnel through barrier layers 141 to transit between bulk layers 121. We refer to a device including such a series of tunneling barriers as a "dots-in-a-fence" (DFENCE) heterostructure.

Analysis was performed of several $p^+$-i-$n^+$ DFENCE heterostructures to test the performance of the architecture and to verify the reduction of charge trapping. Both GaAs and InP bulk layers were utilized. Although the actual shape of the Stranski-Krastanow-grown InAs quantum dots are an equilateral tetrahedron and are commonly modeled as spheres, a simplified approximation of the quantum dots as cylinders was used in these experiments, which was found to provide an adequate approximation. Barrier materials were selected that are lattice matched to the respective bulk material.

Figure 18:
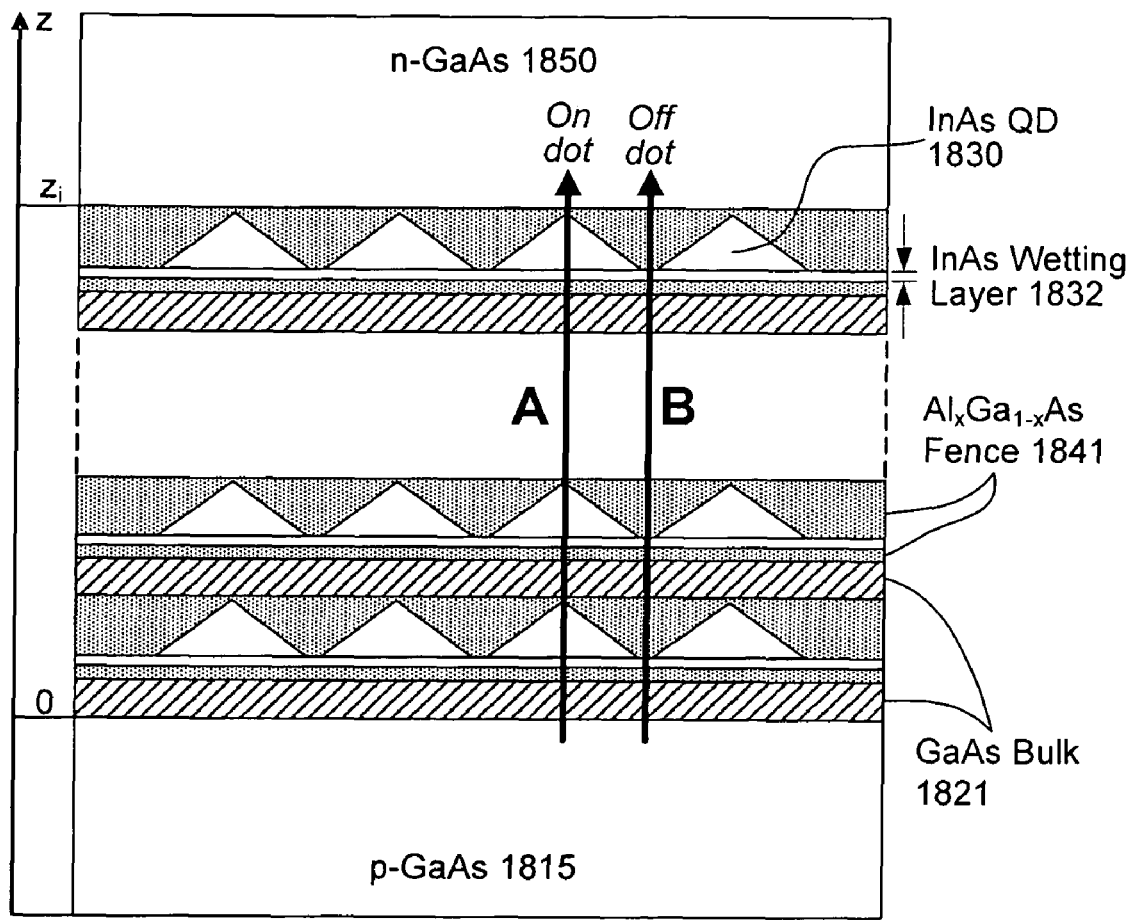
FIG. 18 illustrates a structure of GaAs/InAs intermediate band fence barrier (DFENCE) solar cell. Path A shows transport along on-dot sites through the GaAs buffer, $Al_xGa_{1-x}As$ fences, InAs wetting layers, and InAs quantum dots. Path B shows charge transport along off-dot sites through the GaAs buffer, InAs wetting layers and $Al_xGa_{1-x}As$ fences.

An example GaAs/InAs dots-in-fence structure is illustrated in FIG. 18. The structure includes a p-GaAs layer 1815, a plurality of dots-in-fence barriers, and an n-GaAs layer 1850. A GaAs bulk layer 1821 is grown between each dots-in-fence barrier. A GaAs bulk layer 1821 is also provided on the p-GaAs layer 1815 to promote consistent growth of the first dots-in-fence barrier. Each dots-in-fence barrier includes an $Al_xGa_{1-x}As$ energy barrier "fence" 1841 surrounding InAs quantum dots 1830 and wetting layers 1832 embedded in the GaAs homojunction.

Figures 19A, 19B:
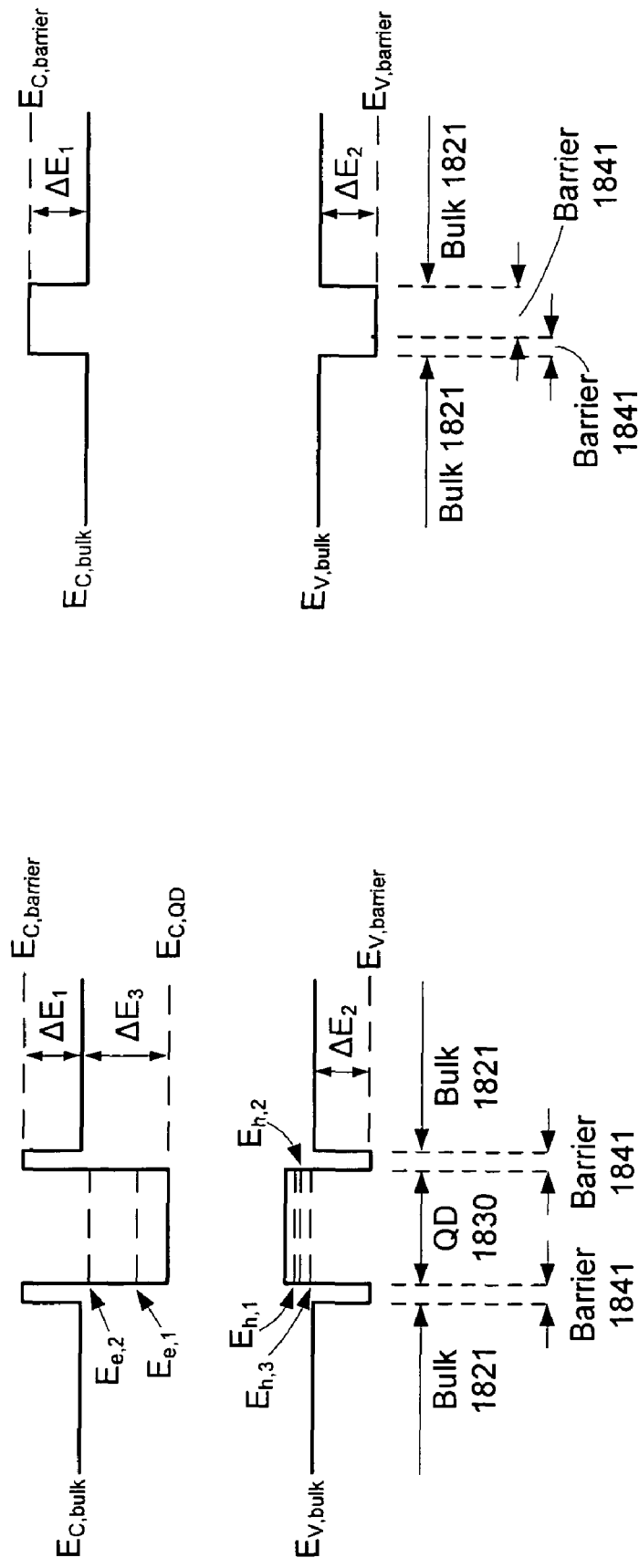
FIGS. 19A and 19B are energy-band diagrams for cross-sections of a DFENCE structure from FIG. 18.

FIG. 19A is an energy diagram through a dot along line "A" in FIG. 18, and FIG. 19B is an energy diagram off-dot along line "B" in FIG. 18. The thin InAs wetting layer 1832 is not believed to be particularly consequential to off-dot tunneling and is omitted as a feature from FIG. 19B.

Although the ideal tunneling barrier deposited over the dots is conformal, as illustrated in FIG. 13, testing was carried out using fairly planar upper barrier layers. As a result, off-dot carrier tunneling (along line "B" in FIG. 18) was reduced in comparison to a conformal barrier, making it easier to detect charge trapping by the quantum dots (as discussed above with FIG. 7).

The maximum solar power conversion efficiency under AM1.5 spectral radiation of the example GaAs-based photovoltaic cell employing 10-20 layers of InAs quantum dots surrounded by $Al_xGa_{1-x}As$ barriers in the junction built-in depletion region can be as high as 45%. Higher efficiencies were anticipated for InP-based cells. This represents a significant improvement over GaAs homojunction cells with maximum efficiencies of <25%.

A model that includes non-ideal charge recombination and leakage current effects is presented, in contrast to previous, idealized calculations of quantum dot solar cells described in A. Luque and A. Marti, Phys. Rev. Lett. 78, 5014(1997). The new model leads to a practical DFENCE heterostructure solar cell, exploiting the self-organized, archetype GaAs/InAs system. Calculations suggest that the DFENCE structure can have power conversion efficiencies for an AM1.5 solar spectrum as high as 45% in non-ideal GaAs structures (compared with <25% for conventional homojunction GaAs cells), and can yield even higher efficiencies using the InAs/InP system.

The structure of the DFENCE heterostructure in FIG. 18 includes multiple layers of quantum dots 1830 in the intrinsic region of a GaAs p$^+$-i-n$^+$ structure. The InAs dots 1830 are sandwiched between two thin, high band-gap $Al_xGa_{1-x}As$ barrier layers 1841, which are, in turn, embedded in GaAs 1821 (and between 1821 and 1850 for the topmost dots-in-fence layer).

For the purpose of the model, the spatial distribution of InAs dots 1830 in the $GaAs/Al_xGa_{1-x}As$ barriers is treated as a dense, periodically arranged array of cylinders with length, l, and radius, R. The thickness, t, of the $Al_xGa_{1-x}As$ fence barrier is assumed to be 0.1 R, and the thickness of the surrounding GaAs layer is d. The period for the quantum dot "unit cell" is L parallel to the plane of the substrate surface, and $L_2$=+d+t normal to that surface.

For determining the 2D band structure, the conduction band offset between the strained InAs dot and GaAs buffer is 70% of their difference in band gaps ($\Delta E_3$ in FIG. 19A), and the conduction band offset between $Al_xGa_{1-x}As$ and GaAs is 67% of their band gap difference ($\Delta E$, in FIG. 19A). For background, see R. Colombelli, V. Piazza, A. Badolato, M. Lazzarino, F. B. W. Schoenfeld and P. Petroff, App. Phys. Lett. 76, 1146 (2000); and P. Harrison, *Quantum Well, Wires and Dots* (Wiley, England, 2005), p. 459.

The electron and hole energy levels at the F point of periodic GaAs/InAs quantum dots buried in $Al_xGa_{1-x}As$ fence barriers along path A in FIG. 18 were calculated by using the matrix elements determined through effective-mass envelope-function theory for the quantum dot with two finite barriers (fence barrier plus host layer). See X. X. Han, J. M. Li, J. J. Wu, G. W. Cong, X. L. Liu, Q. S. Zhu, Z. G. Wang and J. Appl. Phys. 98, 053703 (2005).

Figure 20:
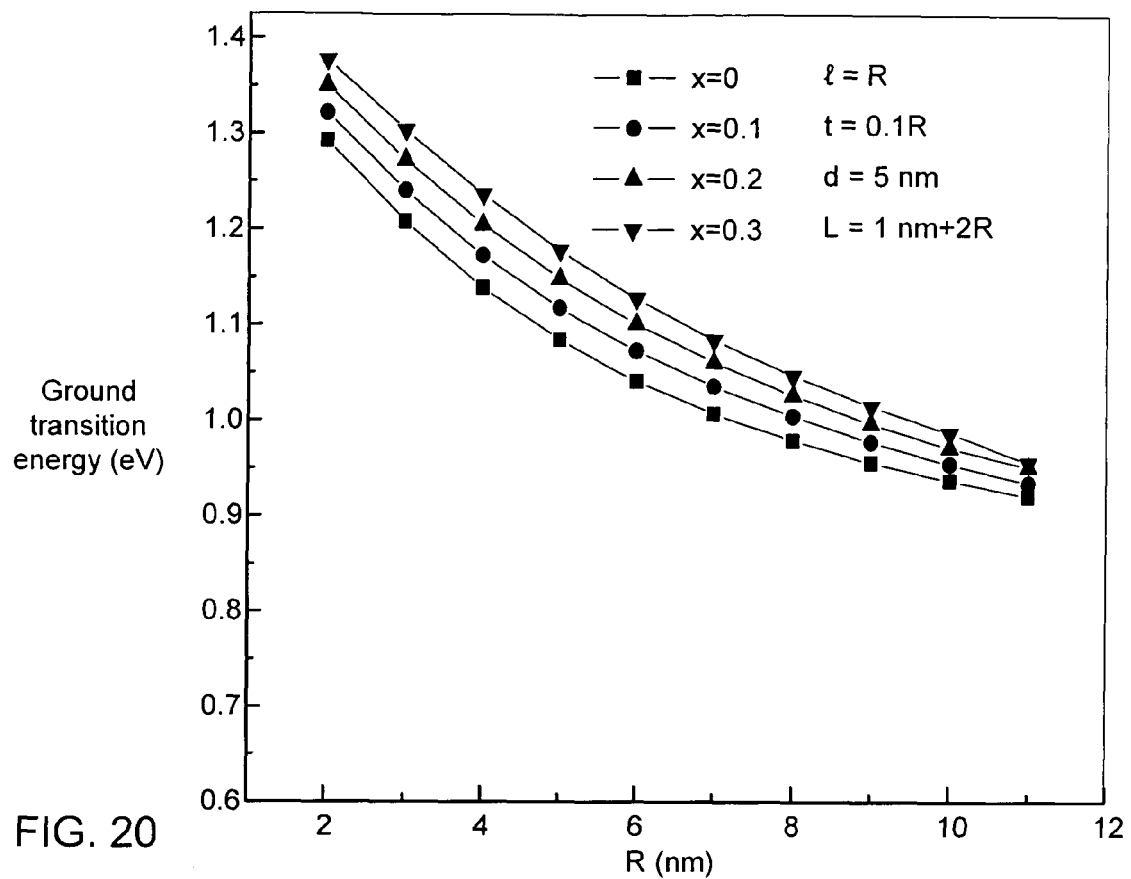
FIG. 20 is a plot of ground state transition energy versus quantum dot radius of (R) for the structure in FIG. 18, with the thickness of fence barrier fixed to t=0.1 R for aluminum fractions of x=0, 0.1, 0.2, and 0.3. Here, l is the dot length and l=R, d is the thickness of the surrounding GaAs layer and d=5 nm, and L is the distance between quantum dots in the plane of the substrate surface and L=1 nm+2 R. The trace for x=0 corresponds to a structure having tunneling barriers.

As the quantum size increases, the ground state photon transition energies decrease due to reduced confinement for the GaAs/InAs quantum dot structure with or without the $Al_xGa_{1-x}As$ fences, as shown in FIG. 20. The incorporation of an $Al_xGa_{1-x}As$ barrier layer (x>0) surrounding the InAs quantum dots slightly increases the ground state photon transition energy due to the additional potential barrier of the fence. When R=8 nm, the lowest transition energy in the absence of a fence is 1.06 eV, consistent with the absorption peak at 1.05±0.05 eV observed in the luminescence of similar sized structures. See J. Y. Marzin, J. M. Gérard, A. Izraë, D. Barrier and G. Bastard, Phys. Rev. Lett. 73, 716 (1994).

Once an electron-hole pair is photogenerated in a quantum dot, the pair can either recombine or escape into the wide band gap host. After escape, the charges are separated by the built-in electric field of the junction, and are collected at the electrodes. The competition between the recombination ($1/\tau_{rec}$) and the escape rates ($1/\tau_{esc}$) determines the photocurrent contributed by the quantum dots. For background see W. H. Chang, T. M. Hsu, C. C. Huang, S. L. Hsu and C. Y. Lai, Phys. Rev. B 62, 6959(2000).

Figure 21:
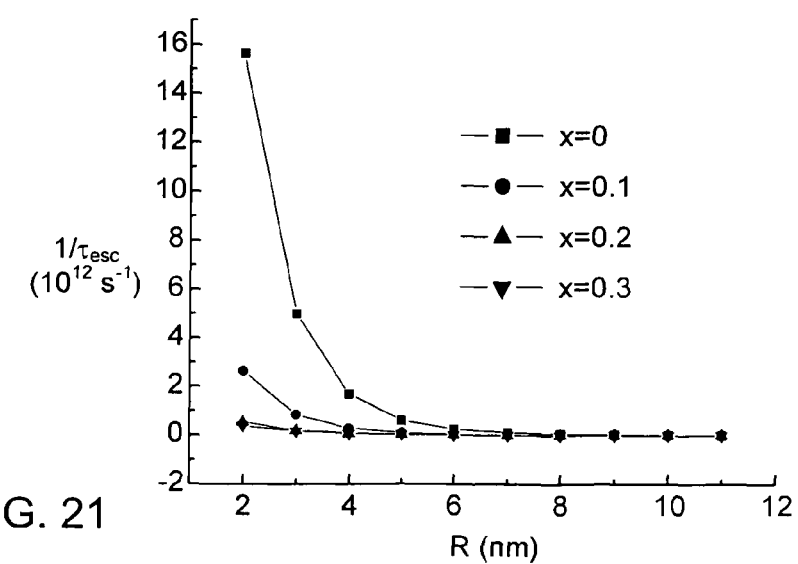
FIG. 21 is a graph of the carrier escape rate versus quantum dot radius for the same structures as in FIG. 20.

The escape rate is calculated based on two processes: direct tunneling through the trapezoidal fence barrier in the presence of the built-in electric field, and thermionic emission from the dot quantum state over the barrier. From FIG. 21, the carrier escape rate decreases from $2.6 \times 10^{12} s^{-1}$ to $3 \times 10^9 s^{-1}$ as both the localized energy level (defined as the difference between the quantum dot state to the conduction band minimum of the GaAs barrier) and the activation energy (see Y. Fu and O. Engström, J. Appl. Phys. 96, 6477 (2004)) are increased with radius ranging from 2 nm to 11 nm when x=0.2. When R≧6 nm, increasing the height of the barrier as controlled by increasing the Al fraction, x, does not lead to a significant change in escape rate as compared to the conventional case with no fence barriers (see FIG. 21).

The photocurrent density from the quantum dots is:

$$j_D(z) = \int_{E_1}^{E_2} e \frac{G(E, z)}{1 + \tau_{esc}/\tau_{rec}} dE, \text{ with} \quad (14)$$

$$J_D = \int_0^{z_i} j_D(z) dz. \quad (15)$$

Here, e is the elementary charge, G(E, z) is the photocarrier generation rate in the quantum dots within the i-region (for background see V. Aroutiounian, S. Petrosyan and A. Khachatryan, J. Appl. Phys. 89, 2268 (2001)), and $E_1$ and $E_2$ are the lower and upper energies for absorption in the quantum dots, respectively. Also, z is the position in the i-region (of total width, $z_i$) as measured from the metallurgical p-n junction, $j_D(z)$ is the incremental photocurrent generated at position z, and $J_D$ is the total photocurrent collected from the N quantum dot layers.

The absorption coefficient of a quantum dot is calculated based on the dipole transition matrix element between the conduction and valance band edge states using Fermi's Golden Rule (see S. Datta, *Quantum Phenomena* (Addison Wesley, New York, 1989), P. 233). Inhomogeneous Gaussian broadening of the photon transition energy contributes a width of approximately 50 meV to the absorption spectrum (see J. Y. Marzin, J. M. Gérard, A. Izraë, D. Barrier and G. Bastard, Phys. Rev. Lett. 73, 716 (1994)). For InAs quantum dot systems, the radiative recombination time is typically $\tau_{rec}$~1 ns (see W. H. Chang, T. M. Hsu, C. C. Huang, S. L. Hsu and C. Y. Lai, Phys. Rev. B 62, 6959 (2000)), as will be used in the subsequent analysis.

To understand the effect of the fence barrier on the charge transport properties along the on-dot (A) and off-dot (B) paths that include the presence of the InAs wetting layer (for background see D. Morris, B. Deveaud, A. Regreny and P. Auvray, Phys. Rev. B 47, 6819 (1993); and T. K. Suzuki, K. Nomoto, K. Taira and I. Hase, Jpn. J. Appl. Phys. 36, 1917 (1997)) in FIG. 18, we calculated the transmission coefficient as a function of the photocarrier and barrier energies based on the transfer matrix method, combined with the envelope function and effective mass approximations (see P. Harrison, *Quantum Well, Wires and Dots* (Wiley, England, 2005), p.459). The average transmission coefficient, <T>, characterizes the electron and hole tunneling efficiency through the fence without trapping into the discrete quantum dot energy levels. The current is then equal to the number of carriers that tunnel along the on-dot paths, which, in turn equals the product of the tunneling probability and the number of carriers at that energy in the GaAs layers. Thus <T>can be expressed as:

$$<T> = \frac{\int_0^\infty N_c(E)f(E)T(E)dE}{\int_0^\infty N_c(E)f(E)dE}, \quad (16)$$

where $N_c(E)$ is the GaAs conduction band density of states, f(E) is the Fermi-Dirac distribution, and T(E) is the transmission coefficient at incident electron energy, E. Along path A, <T> decreases from 65% with no fence barrier, to 25% (for x=0.1) when the fence thickness increases from 0 to 1.6 nm. In contrast, along path B, <T> decreases from 24% (no fence barrier) to 12%. Although the conduction band offset (~0.33 eV—see O. Brandt, H. Lage and K. Ploog, Phys. Rev. B 45, 4217 (1992)) between the InAs wetting layer and the GaAs buffer is comparable to that of the InAs quantum dots and the GaAs buffer (~0.513 eV), the extreme thinness of the wetting layer (<2 nm—see K. Suzuki, K. Nomoto, K. Taira and I. Hase, Jpn. J. Appl. Phys. 36, 1917(1997)) results in a higher 2D ground state energy with few discrete energy levels between the fence barriers. Resonant tunneling from 3D to 0D states in the quantum dots contributes to their high <T>. Hence, photocarriers predominantly tunnel through the quantum dots as a result of the thin fence barriers.

The reverse dark current density due to thermionic emission of electrons and holes from states in the InAs quantum dots and wetting layers (see S. K. Zhang, H. J. Zhu, F. Lu, Z. M. Jiang, X. Wang, Phys. Rev. Lett. 80, 3340 (1998); and O. Engstrom, M. Kaniewska, Y. Fu, J. Piscator and M. Malmkvist, Appl. Phys. Lett.85, 2908 (2004)) is:

$$J_{DR} = evN_{dot} \quad (17)$$
$$\left[N_{cm}\sigma_e\exp\left(\frac{E_e - \Delta E_{c2} - E_c}{kT}\right) + N_{vm}\sigma_h\exp\left(-\frac{E_h + \Delta E_{v2} - E_v}{kT}\right)\right],$$

where $N_{dot}$ is the area density of quantum dots (typically between $4.7\times10^{10}$ and $5\times10^{12}$ cm$^{-2}$ for this material system— see T. S. Yeoh, C. P. Liu, R. B. Swint, A. E. Huber, S. D. Roh, C. Y. Woo, K. E. Lee, J. J. Coleman, Appl. Phys. Lett. 79, 221 (2001)), $N_{cm}$ and $N_{vm}$ are the effective densities of electron and hole states in GaAs, $E_c$ and $E_v$ are the conduction and valence band energies of GaAs, $E_e$ and $E_h$ are the energy eigenvalue for electrons and holes in the InAs quantum dots (referenced to the conduction band edge of the InAs quantum dots), v is the thermal velocity of electrons, $\sigma_e$ and $\sigma_h$ are the electron and hole capture cross sections, respectively, and $\Delta E_2$ is the valence band offset between $Al_xGa_{1-x}As$ and GaAs.

Also, the reverse saturation current, $J_0$, is reduced with an increase in band gap offset energy, $\Delta E$, between GaAs and $Al_xGa_{1-x}As$ layers. Incorporating generation and recombination currents in both the GaAs layers and $Al_xGa_{1-x}As$ fence barriers yields:

$$J = J_0\exp\left(-\frac{\Delta E}{kT}\right)(1 + r_R\beta) \quad (18)$$
$$\left[\exp\left(\frac{qV}{kT}\right) - 1\right] + [J_{NR} + J_s(N) + J_{DR}]\left[\exp\left(\frac{qV}{2kT}\right) - 1\right] - J_{sc},$$

where $r_R$ is the fractional increase in the net i-region recombination at equilibrium due to the incorporation of the fence barrier, β is the ratio of the recombination current in the i-region at equilibrium to the reverse drift current resulting from minority carrier extraction, and $J_{NR}$ is the nonradiative recombination current in the intrinsic GaAs regions (see N. G. Anderson, J. Appl. Phys. 78, 1850 (1995)). Also, $J_s$ocN is the interface recombination current at the off-dot sites (see J. C. Rimada, L. Hernandez, J. P. Connolly and K. W. J. Barnham, Phys. Stat. Sol. (b) 242, 1842 (2005)), and $J_{sc}$ is the short-circuit current density under illumination.

Figure 22:
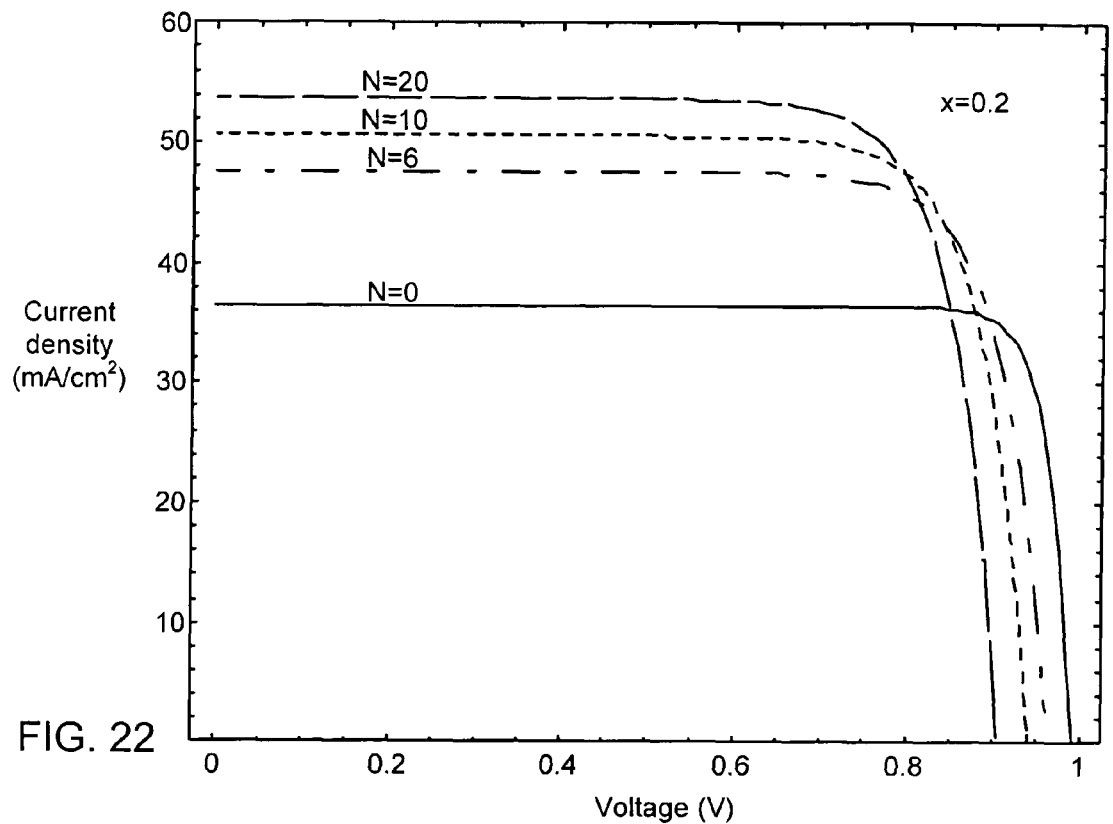
FIG. 22 is a graph of current density versus voltage for GaAs DFENCE heterostructures as a function of the number of stacked quantum dot layers N (x=0.2).

Solar cells employing a direct-gap semiconductor such as GaAs have close to 100% internal quantum efficiency, and behave as temperature independent, constant-current sources proportional to the illumination intensity. The calculated current density-voltage characteristics using Equation (18) are shown for the quantum dot intermediate band solar cells in FIG. 22. In the absence of the quantum dots, the calculated open-circuit voltage, $V_\infty$=1.01 eV, is consistent with the experimental results for GaAs homojunction solar cells (see S. P. Tobin, S. M. Vernon, C. Bajgar, S. J. Wojtczuk, M. R. Melloch, A. Keshavarzi, T. B. Stellwag, S. Venkatensan, M. S. Lundstrom and K. A. Emery, IEE Trans. Electron Devices 37, 469 (1990)). With an increase in the number of quantum dot layers, $J_{sc}$ increases for x=0.2 as a result of absorption of the sub-GaAs-bandgap photons, while $V_\infty$ is reduced only slightly from 1.01 eV (N=1) to 0.91 eV (N=20) due to recombination at $GaAs/Al_xGa_{1-x}As$ interfaces along path B, and nonradiative recombination in the GaAs i-region.

Figure 23:
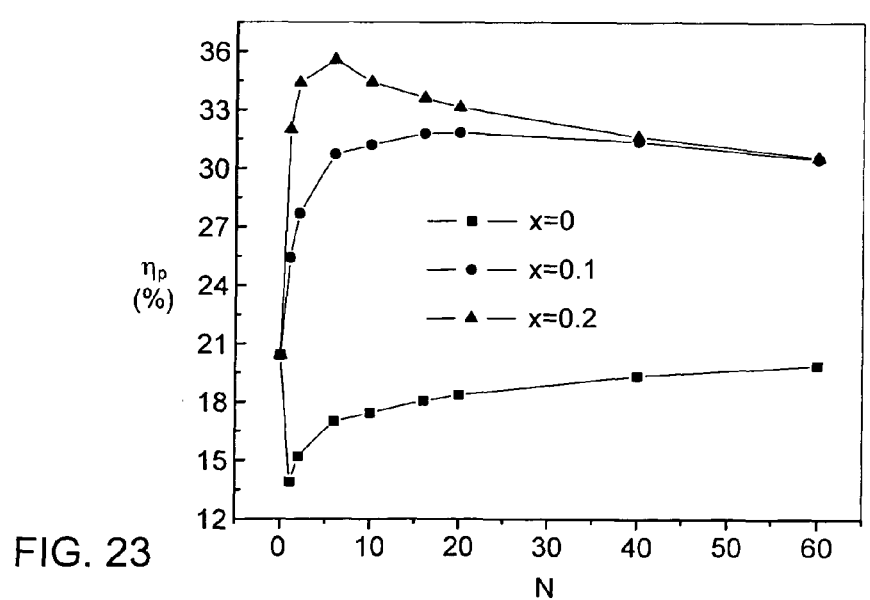
FIG. 23 is a graph of power conversion efficiency versus number of quantum dot layers (N) for quantum dots with a radius of 8 nm when x increases from 0 to 0.2. The DFENCE structure is otherwise as described in FIG. 20 (t=0.1 R=0.8 nm; d=5 nm; L=1 nm+2 R=17 nm).

The calculated solar power conversion efficiency ($\eta_p$) for DFENCE cells under 1 sun (116 mW/cm$^2$), AM1.5 illumination, is shown in FIG. 23. Without the fence barrier (x=0), $V_\infty$ decreases to 0.54 eV with an increase in the number (N) of stacked quantum dot layers as a result of the large, thermally excited reverse saturation current ($J_{DR}$~10$^{-5}$–10$^{-6}$ A/cm$^2$) and non-radiative recombination in the InAs. Correspondingly, the power conversion efficiency is reduced from 20% (without quantum dots) to 15% in the quantum dot cell. Hence, the power conversion efficiency is actually reduced in the quantum dot intermediate band solar cells as proposed by Luque and Martí(Phys. Rev. Lett. 78, 5014(1997)), which is consistent with experimental results.

In contrast, with the incorporation of $Al_xGa_{1-x}As$ fence (assuming x=0.1 to 0.2), the power conversion efficiency can be as high as 36% with N=6 to 20 quantum dot layers and R=8 nm due to the greatly reduced $J_{DR}$. When non-radiative recombination in the $GaAs/Al_xGa_{1-x}As$ layers dominates over generation in the quantum dots, $\eta_p$ decreases with N. Due to competition between the absorption of sub-bandgap photons and recombination losses in the i-region, the optimal value of N is from 10 to 20. The greatly reduced reverse saturation current resulting from the incorporation of the $Al_xGa_{1-x}As$ fence, and increased short circuit current from the quantum dots, contributes to the enhanced power conversion efficiency.

Figure 24:
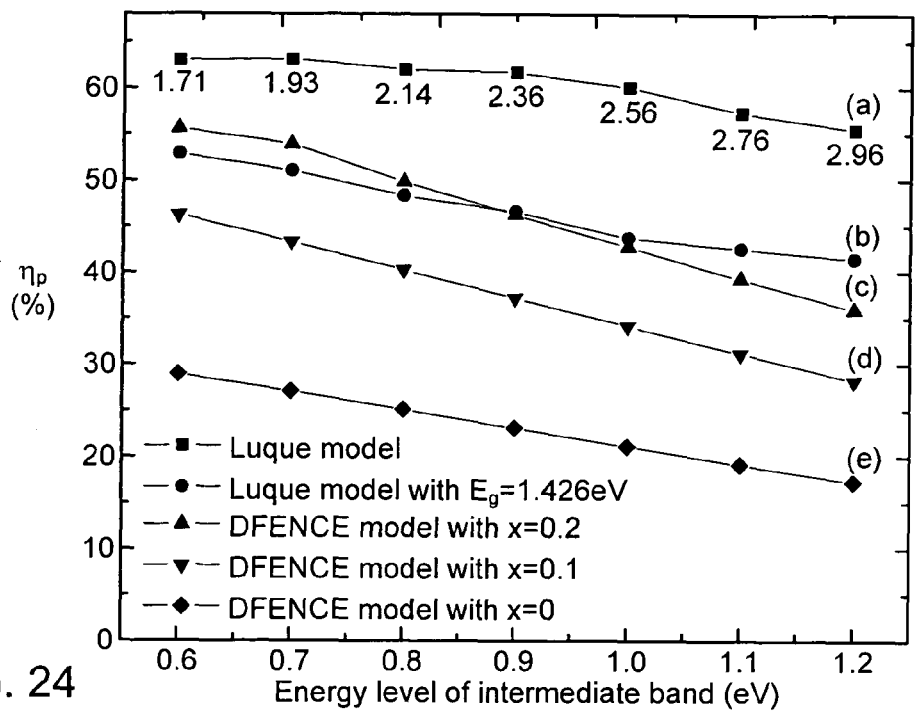
FIG. 24 is a graph of power conversion efficiency versus intermediate band energy level calculated for: (a) the ideal conditions proposed in the paper A. Luque and A. Marti, Phys. Rev. Lett. 78, 5014 (1997)("Luque model"), (b) the Luque model for GaAs with the band gap of 1.426 eV, and (c), (d) and (e) a respective upper limit of the GaAs/InAs DFENCE model with x=0.2, 0.1 and 0. The labeled data in curve (a) is the bulk band gap assumed that corresponds with the intermediate band level on the abscissa to achieve maximum efficiency.

The model of Luque, et al. predicts the maximum achievable power conversion efficiency of an ideal (i.e. no recombination or saturation current effects) hypothetical (i.e. independent of a specific materials combination) quantum dot cell by choosing an optimal combination of intermediate quantum level and bulk band gap (curve (a) in FIG. 24). Hence, to determine the performance of practical cells with realizable materials systems for comparison to the DFENCE architecture, it is necessary to calculate the corresponding maximum power conversion efficiency of GaAs/InAs-based quantum dot intermediate band solar cells without fence barriers. The result of that calculation is shown by curve (b). In this case, the maximum $\eta_p$ of GaAs-based intermediate band solar cells is 52%, with the intermediate band energy of between 0.6 eV and 0.7 eV, referenced to the valence band edge of GaAs.

Assuming that all incident photons with energies above the intermediate band level in the cell are absorbed in the intrinsic region of the DFENCE heterostructure, the upper limit for $\eta_p$ with N=10 approaches $\eta_p$=55% of Luque, et al. for an idealized quantum dot structure whose intermediate band level is 0.6 eV (curve (c), FIG. 24); correspondingly, the ground state transition energy referenced to the discrete energy level of holes in InAs quantum dots should be 0.45 eV. Unfortunately, such a low ground state transition energy is not attainable due to the quantum confinement and large strain in the InAs dots (see FIG. 20).

With an increase in intermediate band energy or ground state transition energy, the upper limit of the DFENCE structure efficiency decreases due to the concomitant reduction in sub-bandgap photocurrent. When the intermediate band energy is 1.2 eV (corresponding to the ground state transition energy of 1.05 eV in FIG. 20), $\eta_p$=36% (x=0.2, curve(c)). The decrease of the potential barrier resulting from a decrease in Al concentration, x, results in decrease in $\eta_p$ that decreases from 28% (x=0.1, curve (d)) to 17% (x=0, curve (e)) at the same intermediate band level of 1.2 eV. No significant enhancement in $\eta_p$ for quantum dot cells lacking a fence from curve (e) is observed in FIG. 24. When the ground state photon transition energy is between 0.9 eV and 1.05 eV (x=0.2, curve (c)), corresponding to an intermediate band level of between 1.05 eV and 1.20 eV, $\eta_p$ of 35% to 45% is obtainable for N≧10.

Based on the analysis of the data for the GaAs/InAs dots-in-a-fence structure, an average lateral cross-section of each quantum dot (2 R) preferably satisfies 2 nm≦R≦10 nm, with each $Al_xGa_{1-x}As$ layer having a thickness (t) satisfying 0.1 R≦t≦0.3R, and each GaAs layer disposed between two dots-in-a-fence barriers having a thickness (d) satisfying 2 nm≦d≦10 nm. To approximate the escape rate of the structure with no fence barriers the average lateral cross-section of each dot should preferably satisfies 6 nm≦R≦10 nm. A period of a quantum dot unit cell within a respective dots-in-a-fence barrier (L) preferably satisfies 2 R≦L≦2R+2 nm. The density of InAs quantum dots is preferably $10^{10}$ to $10^{12}$ quantum dots per square centimeter.

Including the thin fence barriers surrounding quantum dots opens a new opportunity for narrowing the performance gap between high performance multijunction solar cells and ideal intermediate band quantum dot solar cells. There are several advantages of incorporating the DFENCE energy barrier structure: (i) Resonant tunneling through on-dot and off-dot sites becomes possible by adjusting the height (via semiconductor alloy composition) and the thickness of the fence barrier without trapping in the quantum dots or wetting layers; (ii) The fences allow the quantum dots to function primarily as sub-band gap photocarrier generation centers rather than as sites for undesirable recombination, without affecting $V_{oc}$; and (iii) The reverse saturation current due to thermally generated minority carriers at the depletion layer edges and in the interior of the InAs layers is considerably reduced by the band gap offset between the fence and the narrow bandgap host layers. With these properties, GaAs-based quantum dot intermediate band DFENCE solar cells promise power conversion efficiencies as high as 45%.

Heterostructures employing an energy fence can also be exploited in the InP-based materials system. An InP/InAs system has approximately a 3% lattice mismatch in comparison to the 6% to 7% mismatch with GaAs/InAs, such that the optimal dot size in the InP/InAs system tends to be smaller. With an InP bulk, the minimum transition energies in the InAs quantum dots can be as low as 0.65 eV (see M. Holm, M. E. Pistol and C. Pryor, J. Appl. Phys. 92, 932 (2002)), corresponding to the energy that yields the maximum power conversion efficiency of nearly 55%, as shown in FIG. 24.

Figure 25:
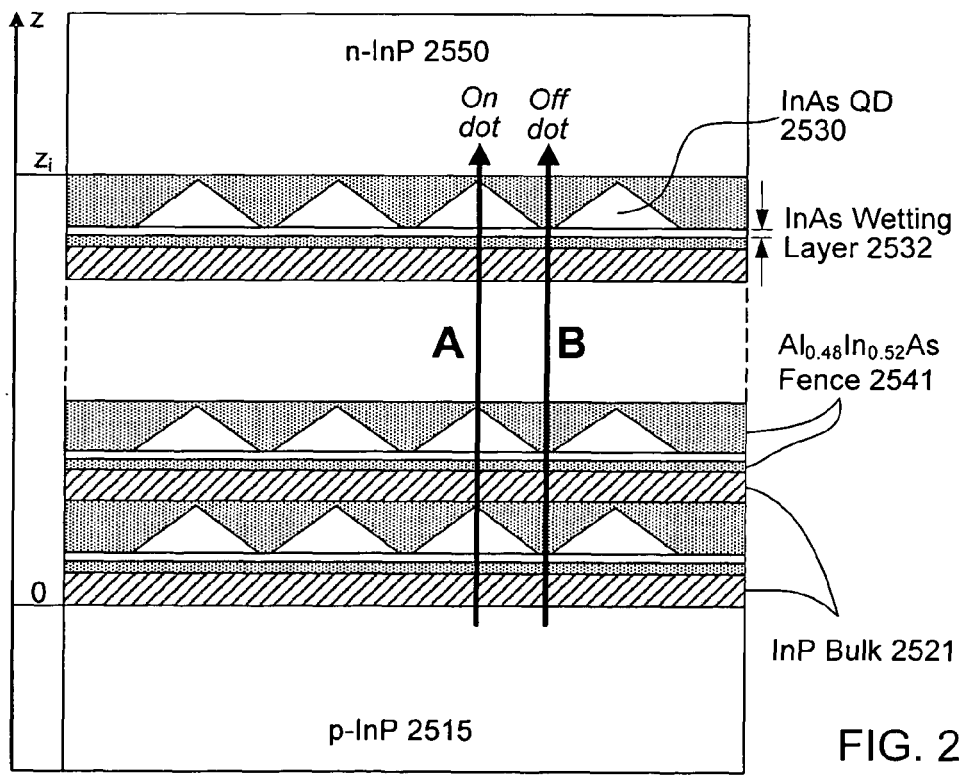
FIG. 25 illustrates a structure of an InP/InAs intermediate band fence barrier (DFENCE) solar cell. Path A shows transport along on-dot sites through the InP buffer, $Al_{0.48}In_{0.52}As$ fences, InAs wetting layers, and InAs quantum dots. Path B shows charge transport along off-dot sites through the InP buffer, InAs wetting layers and $Al_{0.48}In_{0.52}As$ fences.

FIG. 25 illustrates an InP/InAs DFENCE structure. The structure includes a p-InP layer 2515, a plurality of dots-in-fence barriers, and an n-InP layer 2550. A InP bulk layer 2521 is grown between each dots-in-fence barrier. A InP bulk layer 2521 is also provided on the p-InP layer 2515 to promote consistent growth of the first dots-in-fence barrier. Each dots-in-fence barrier includes an $Al_{0.48}In_{0.52}As$ energy barrier "fence" 2541 surrounding InAs quantum dots 2530 and wetting layers 2532 embedded in the InP homojunction.

Figure 26B:
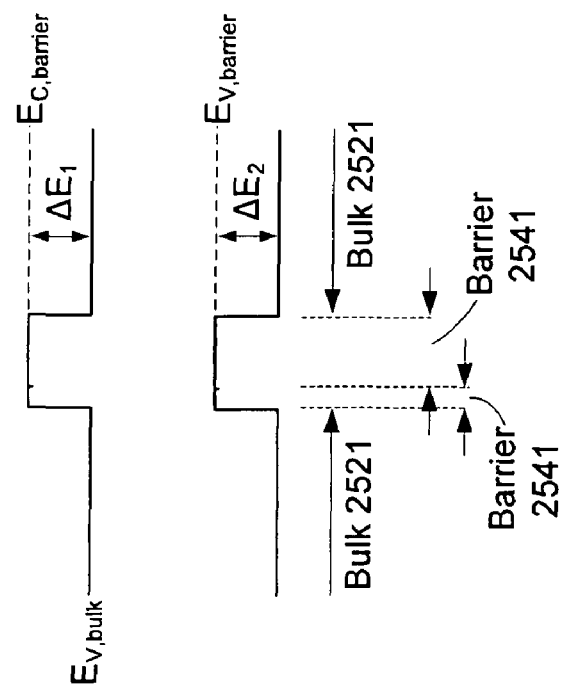
FIGS. 26A and 26B are energy-band diagrams for cross-sections of a DFENCE structure from FIG. 25.
Figure 26A:
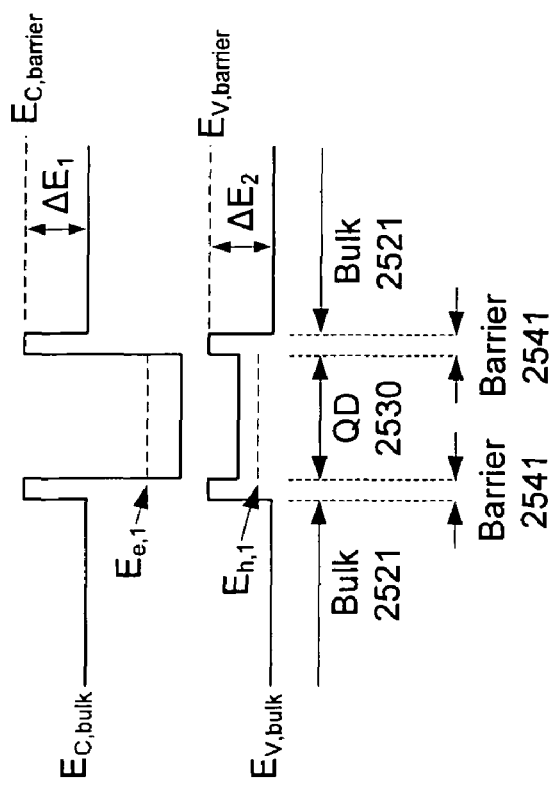

FIG. 26A is an energy diagram through a dot along line "A" in FIG. 25, and FIG. 26B is an energy diagram off-dot along line "B" in FIG. 25. The thin InAs wetting layer 2532 is not believed to be particularly consequential to off-dot tunneling and is omitted as a feature from FIG. 26B.

Figure 27:
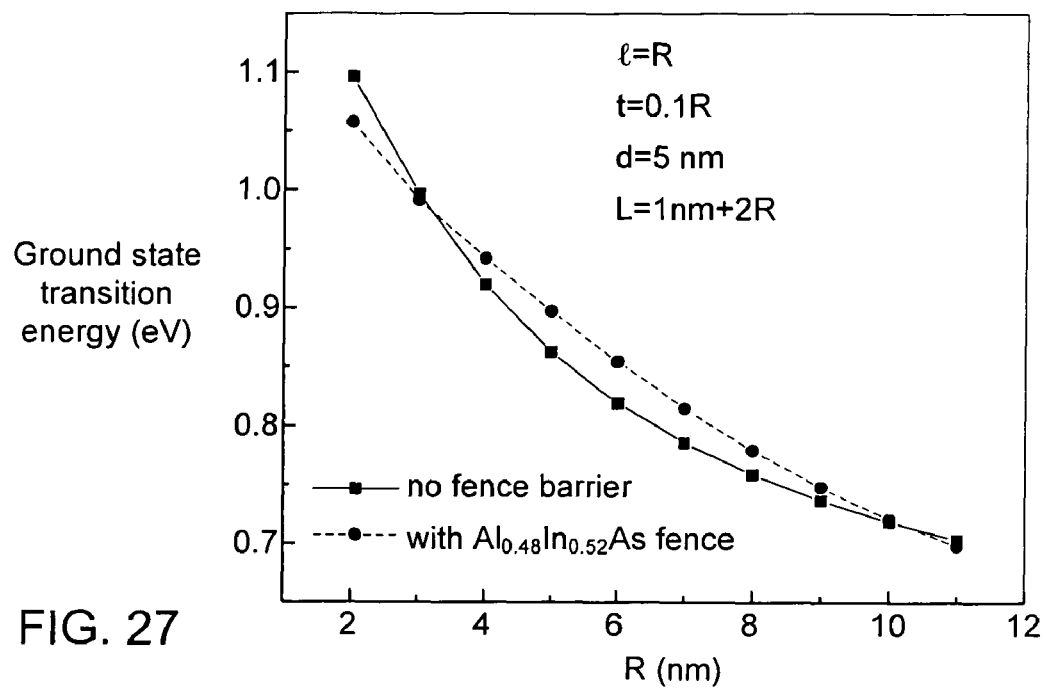
FIG. 27 is a plot of ground state transition energy versus quantum dot radius of (R) for the structure in FIG. 25, with the thickness of fence barrier fixed to t=0.1 R. Here, l is the dot length and l=R, d is the thickness of the surrounding GaAs layer and d=5 nm, and L is the distance between quantum dots in the plane of the substrate surface and L=1 nm+2 R. The data is also included for the same structure with no tunneling barriers.

FIG. 27 is a plot of ground state transition energy versus quantum dot radius of (R) for the structure in FIG. 25, with the thickness of fence barrier fixed to t=0.1 R. Here, l is the dot length and l=R, d is the thickness of the surrounding GaAs layer and d=5 nm, and L is the distance between quantum dots in the plane of the substrate surface and L=1 nm+2 R. The data is also included for the same structure with no tunneling barriers. As the quantum size increases, the ground state photon transition energies decrease due to reduced confinement for the InP/InAs quantum dot structure with or without the $Al_{0.48}In_{0.52}As$ fences.

Figure 28:
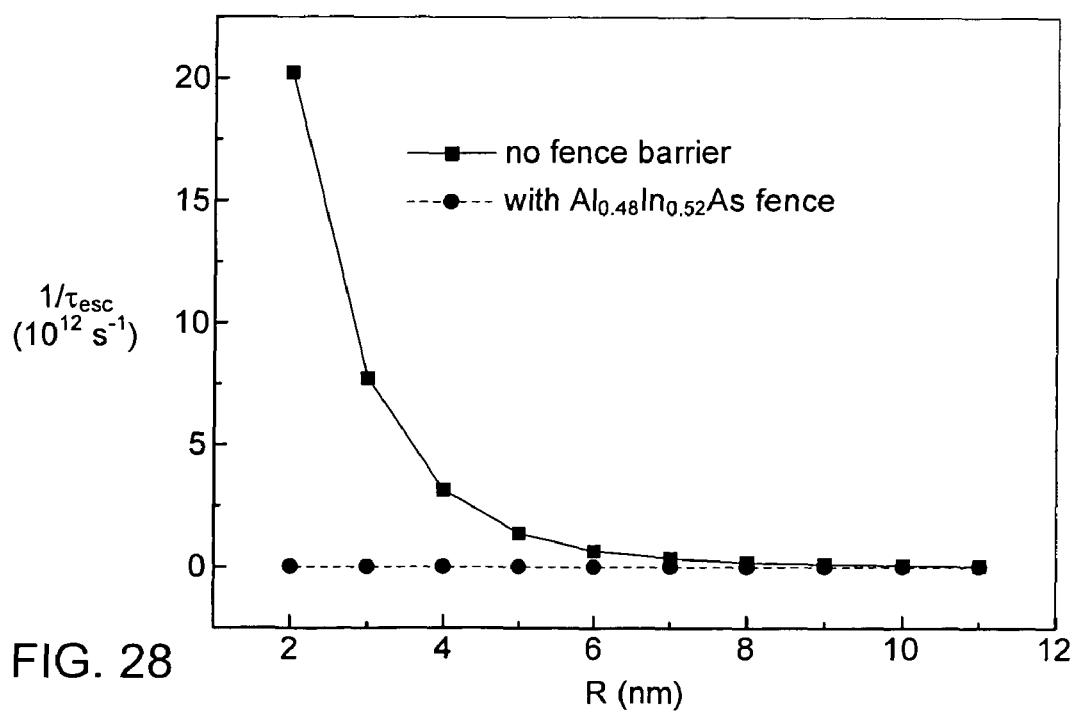
FIG. 28 is a graph of the carrier escape rate versus quantum dot radius for the structure as in FIG. 25, and an equivalent structure having no tunneling barriers.
Figure 29:
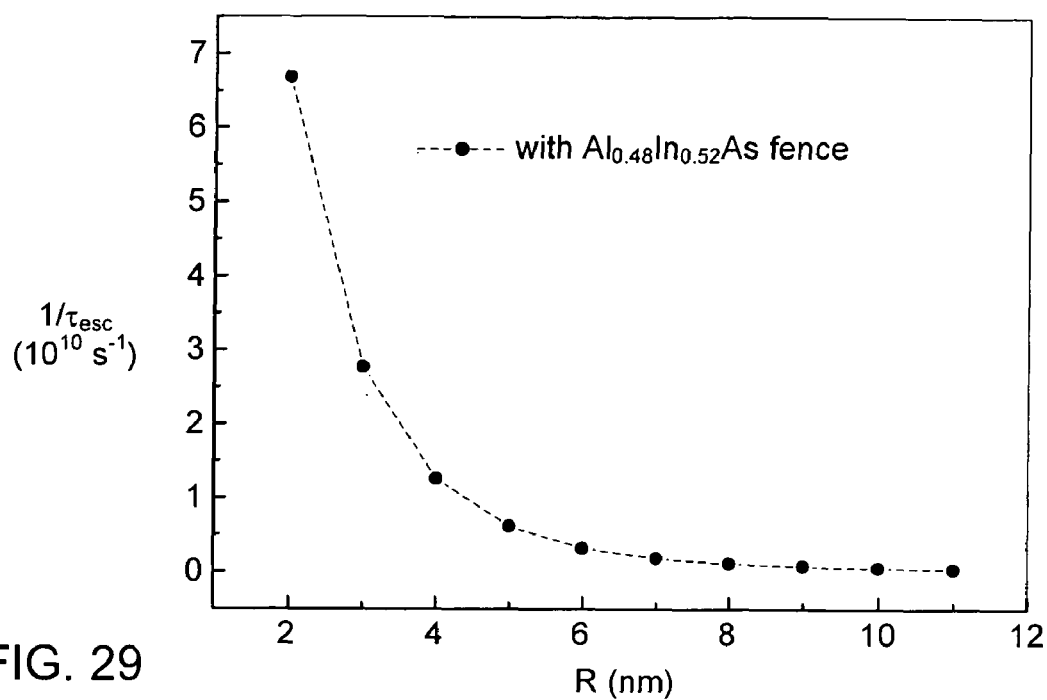
FIG. 29 is a graph of the carrier escape rate versus quantum dot radius for the structure as in FIG. 25. In view of the escape rate in FIG. 28 appearing to be zero, the y-axis scale in FIG. 29 is adjusted to more clearly show the escape rate for the DFENCE structure.

The escape rate was calculated, as described above for GaAs, for the InP/InAs structure both with and without the $Al_{0.48}In_{0.52}As$ fences as shown in FIG. 28. In view of the escape rate in FIG. 28 appearing to be zero, the y-axis scale in FIG. 29 is adjusted to more clearly show the escape rate for the DFENCE structure.

Figure 30:
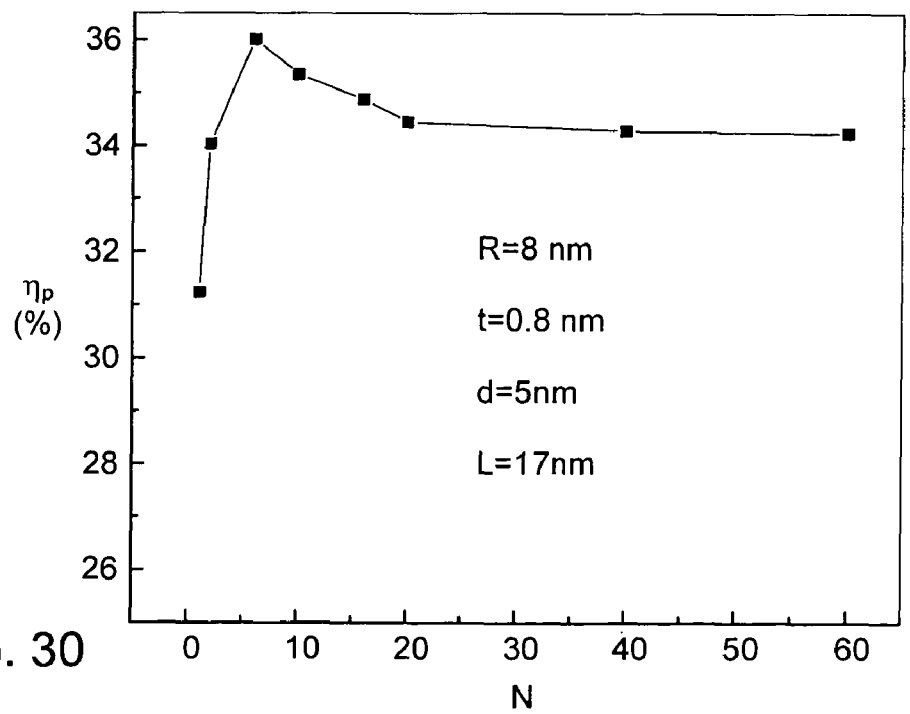
FIG. 30 is a graph of power conversion efficiency versus number of quantum dot layers (N) for quantum dots with a radius of 8 nm. The DFENCE structure is otherwise as described in FIG. 27 (t=0.1 R=0.8 nm; d=5 nm; L=1 nm+2 R=17 nm).

FIG. 30 is a graph of power conversion efficiency versus number of quantum dot layers (N) for quantum dots with a radius of 8 nm. The DFENCE structure is otherwise as described in FIG. 27 (t=0.1 R=0.8 nm; d=5 nm; L=1 nm+2 R=17 nm).

Figure 31:
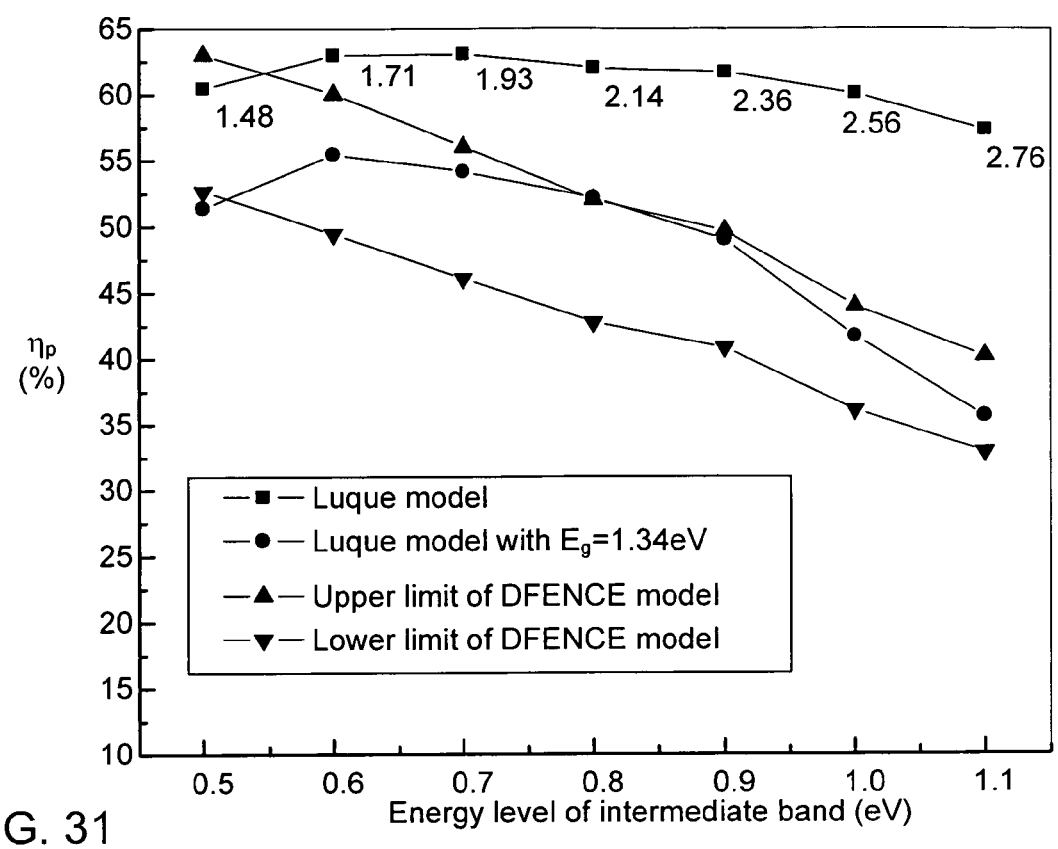
FIG. 31 is a graph of power conversion efficiency versus intermediate band energy level calculated for: the ideal conditions proposed in the Luque model, the Luque model for InP with the band gap of 1.34 eV, an upper limit of the InP/InAs DFENCE model. The labeled data on the ideal Luque model curve is the bulk band gap assumed that corresponds with the intermediate band level on the abscissa to achieve maximum efficiency.

FIG. 31 is a graph of power conversion efficiency versus intermediate band energy level calculated for: the ideal conditions proposed in the Luque model, the Luque model for InP with the band gap of 1.34 eV, an upper limit of the InP/InAs DFENCE model. The labeled data on the ideal Luque model curve is the bulk band gap assumed that corresponds with the intermediate band level on the abscissa to achieve maximum efficiency.

Based on the analysis of the data for the InP/InAs dots-in-a-fence structure, an average lateral cross-section of each quantum dot (2 R) preferably satisfies 2 nm≦R≦12 nm, with each $Al_{0.48}In_{0.52}As$ layer having a thickness (t) satisfying 0.1 R≦t≦0.3 R, and each InP layer disposed between two dots-in-a-fence barriers having a thickness (d) satisfying 2 nm≦d≦12 nm. A period of a quantum dot unit cell within a respective dots-in-a-fence barrier (L) preferably satisfies 2 R≦L≦2 R+2 nm.

Although the barrier materials for the dots-in-a-fence structure used in the experiments were lattice matched to the bulk material, a small mismatch in lattice constants (e.g., |Δα/α|<1%) can be tolerated so long as the mismatch does not induce defects.

As described above, organic photosensitive devices of the present invention may be used to generate electrical power from incident electromagnetic radiation (e.g., photovoltaic devices). The device may be used to detect incident electromagnetic radiation (e.g., a photodetector or photoconductor cell). If used as a photoconductor cell, the transition layers 115/1815/2515 and 150/1850/2550 may be omitted.

Specific examples of the invention are illustrated and/or described herein. However, it will be appreciated that modifications and variations of the invention are covered by the above teachings and within the purview of the appended claims without departing from the spirit and scope of the invention.

What is claimed is:

1. A device comprising:
a first electrode and a second electrode;
a plurality of layers of a first semiconductor material disposed in a stack between the first electrode and the second electrode; and
a plurality of dots-in-a-fence barrier layers, each dots-in-a-fence barrier layer consisting essentially of a plurality of quantum dots of a second semiconductor material embedded between and in direct contact with two layers of a third semiconductor material,
wherein each dots-in-a-fence barrier layer is disposed in the stack between and in direct contact with a respective two of the plurality of layers of the first semiconductor material, wherein each quantum dot provides at least one quantum state at an energy between a conduction band edge and a valence band edge of adjacent layers of the first semiconductor material, wave functions of said at least one quantum state of the plurality of quantum dots to overlap as at least one intermediate band, and
the layers of the third semiconductor material are arranged as tunneling barriers to require a first electron and/or a first hole in a layer of the first semiconductor material to perform quantum mechanical tunneling to reach the second semiconductor material within a respective quantum dot, and to require a second electron and/or a second hole in a layer of the first semiconductor material to perform quantum mechanical tunneling to reach another layer of the first semiconductor material.

2. The device of claim 1, wherein the third semiconductor material is lattice matched to the first semiconductor material.

3. The device of claim 1, wherein a first layer of the plurality of layers of the first semiconductor material nearest to the first electrode is n-doped, a second layer of the plurality of layers of the first semiconductor material nearest to the second electrode is p-doped, and other layers of the plurality of layers of the first semiconductor material are intrinsic.

4. The device of claim 1, wherein said at least one quantum state in each quantum dot includes a quantum state above a band gap of the second semiconductor material providing an intermediate band.

5. The device of claim 1, wherein said at least one quantum state in each quantum dot includes a quantum state below a band gap of the second semiconductor material providing an intermediate band.

6. The device of claim 1, wherein the first semiconductor material is GaAs, the second semiconductor material is InAs, and the third semiconductor material is $Al_xGa_{1-x}As$ with $x>0$.

7. The device of claim 6, wherein:
each InAs quantum dot has an average lateral cross-section of 2 R and a height of l, with 2 nm≦R≦10 nm;
each $Al_xGa_{1-x}As$ layer has a thickness t, with 0.1 R≦t≦0.3 R; and each GaAs layer disposed between two dots-in-a-fence barrier layers has a thickness d, with 2 nm≦d≦10 nm.

8. The device of claim 7, wherein:
a period of a quantum dot unit cell within a respective dots-in-a-fence barrier layer is L, with 2 R≦L≦2 R+2 nm; and
a period of a quantum dot unit cell between adjacent dots-in-a-fence barrier layer is $L_z$, with $L_z$=l+d+t.

9. The device of claim 7, wherein 6 nm≦R≦8 nm.

10. The device of claim 9, wherein there are $10^{10}$ to $10^{12}$ quantum dots per square centimeter.

11. The device of claim 6, wherein a first layer of the plurality of GaAs layers nearest to the first electrode is n-doped, a second layer of the plurality of GaAs layers nearest to the second electrode is p-doped, and other layers of the plurality of GaAs layers are intrinsic.

12. The device of claim 6, wherein said at least one quantum state in each quantum dot includes a quantum state above a band gap of InAs providing an intermediate band.

13. The device of claim 6, wherein said at least one quantum state in each quantum dot includes a quantum state below a band gap of InAs providing an intermediate band.

14. The device of claim 1, wherein the first semiconductor material is InP, the second semiconductor material is InAs, and the third semiconductor material is $Al_{0.48}In_{0.52}As$.

15. The device of claim 14, wherein: each InAs quantum dot has an average lateral cross-section of 2 R and a height of l, with 2 nm≦R≦12 nm;
each $Al0.48In_{0.52}As$ layer has a thickness t, with 0.1 R≦t≦0.3 R; and
each InP layer disposed between two dots-in-a-fence barrier layers has a thickness d, with 2 nm≦d≦12 nm.

16. The device of claim 15, wherein:
a period of a quantum dot unit cell within a respective dots-in-a-fence barriers barrier layer is L, with 2 R≦L≦2 R+2 nm; and
a period of a quantum dot unit cell between adjacent dots-in-a-fence barrier layers is $L_z$, with $L_z$=l+d+t.

17. The device of claim 14, wherein a first layer of the plurality of InP layers nearest to the first electrode is n-doped, a second layer of the plurality of InP layers nearest to the second electrode is p-doped, and other layers of the plurality of InP layers are intrinsic.

18. The device of claim 14, wherein said at least one quantum state in each quantum dot includes a quantum state above a band gap of InAs providing an intermediate band.

19. The device of claim 14, wherein said at least one quantum state in each quantum dot includes a quantum state below a band gap of InAs providing an intermediate band.

* * * * *

UNITED STATES PATENT AND TRADEMARK OFFICE
CERTIFICATE OF CORRECTION

| | | |
|---|---|---|
| PATENT NO. | : 7,750,425 B2 | Page 1 of 1 |
| APPLICATION NO. | : 11/598006 | |
| DATED | : July 6, 2010 | |
| INVENTOR(S) | : Stephen R. Forrest et al. | |

It is certified that error appears in the above-identified patent and that said Letters Patent is hereby corrected as shown below:

Col. 26, line 3, "height of l" should read -- height of $\ell$ --.

Col. 26, line 13, "$L_z = 1+d+t$" should read -- $L_z = \ell+d+t$ --.

Col. 26, line 32-33, "height of l" should read -- height of $\ell$ --.

Col. 26, line 40, delete "barriers" before -- barrier --.

Col. 26, line 43, "$L_z = 1+d+t$" should read -- $L_z = \ell+d+t$ --.

Signed and Sealed this
Fifteenth Day of March, 2011

David J. Kappos
*Director of the United States Patent and Trademark Office*